(12) United States Patent
Sakaguchi

(10) Patent No.: US 9,608,229 B2
(45) Date of Patent: Mar. 28, 2017

(54) ORGANIC EL LIGHTING PANEL SUBSTRATE, ORGANIC EL LIGHTING PANEL, AND ORGANIC EL LIGHTING DEVICE

(71) Applicant: NEC LIGHTING, LTD., Tokyo (JP)

(72) Inventor: Yoshikazu Sakaguchi, Tokyo (JP)

(73) Assignee: NEC LIGHTING, LTD., Tokyo (JP)

(\*) Notice: Subject to any disclaimer, the term of this patent is extended or adjusted under 35 U.S.C. 154(b) by 181 days.

(21) Appl. No.: 14/391,705

(22) PCT Filed: Dec. 4, 2012

(86) PCT No.: PCT/JP2012/081311
§ 371 (c)(1),
(2) Date: Oct. 10, 2014

(87) PCT Pub. No.: WO2013/153700
PCT Pub. Date: Oct. 17, 2013

(65) Prior Publication Data
US 2015/0115242 A1 Apr. 30, 2015

(30) Foreign Application Priority Data
Apr. 12, 2012 (JP) .................................. 2012-091282

(51) Int. Cl.
*H01L 29/08* (2006.01)
*H01L 35/24* (2006.01)
(Continued)

(52) U.S. Cl.
CPC ...... *H01L 51/5228* (2013.01); *H01L 51/0096* (2013.01); *H01L 51/52* (2013.01);
(Continued)

(58) Field of Classification Search
USPC .... 257/40, 98; 313/110, 503, 504, 505, 506, 313/512
See application file for complete search history.

(56) References Cited

U.S. PATENT DOCUMENTS

2010/0127617 A1 5/2010 Hayafuji et al.
2012/0194063 A1 8/2012 Hayafuji et al.

FOREIGN PATENT DOCUMENTS

JP 10-199680 7/1998
JP 2002-050468 2/2002
(Continued)

OTHER PUBLICATIONS

International Search Report PCT/JP2012/081311 dated Feb. 5, 2013.

*Primary Examiner* — Telly Green
(74) *Attorney, Agent, or Firm* — Young & Thompson

(57) ABSTRACT

Disclosed is an organic EL lighting panel substrate that can improve the uniformity in luminance and chromaticity in an organic EL lighting panel plane and can suppress deterioration in reliability due to disconnection and the like caused by an auxiliary electrode. The organic EL lighting panel substrate (10) includes: a light-transmitting substrate (11); and a transparent electrode (12). The transparent electrode (12) is arranged on one surface of the light-transmitting substrate (11). The organic EL lighting panel substrate (10) further includes an auxiliary electrode (13) electrically connected to the transparent electrode (12). The light-transmitting substrate (11) has a groove (11c), and the auxiliary electrode (13) is arranged in the groove (11c) of the light-transmitting substrate (11). The auxiliary electrode (13) is formed of a material having a volume resistivity at 20° C. in the range from $1.59 \times 10^{-8}$ to $13 \times 10^{-8}$ Ω·m.

20 Claims, 16 Drawing Sheets

(51) Int. Cl.
*H01L 51/00* (2006.01)
*H01L 51/52* (2006.01)

(52) U.S. Cl.
CPC ...... *H01L 51/5212* (2013.01); *H01L 51/5234* (2013.01); *H01L 51/5271* (2013.01); *H01L 2251/5361* (2013.01)

(56) References Cited

FOREIGN PATENT DOCUMENTS

| | | | | |
|---|---|---|---|---|
| JP | 2005-050552 | | 2/2005 | |
| JP | 2007-287419 | | 11/2007 | |
| JP | 2008-047355 | | 2/2008 | |
| JP | 2008-277202 | * | 11/2008 | ............ H01L 51/50 |
| JP | 2011-071024 | | 4/2011 | |
| JP | 2012-059609 | * | 3/2012 | ............ H01L 51/50 |
| WO | 2008126267 | | 10/2008 | |
| WO | 2011016724 | | 2/2011 | |

* cited by examiner (a)

(b)

(f)

(g)

(h)

(a)

(b)

(c)

(d)

(e)

(f)

(g)

ORGANIC EL LIGHTING PANEL SUBSTRATE, ORGANIC EL LIGHTING PANEL, AND ORGANIC EL LIGHTING DEVICE

TECHNICAL FIELD

The present invention relates to an organic EL lighting panel substrate, an organic EL lighting panel, and an organic EL lighting device.

BACKGROUND ART

In an organic EL (electroluminescent) lighting panel used in an organic EL lighting device, a transparent electrode formed of ITO, ZnO, $SnO_2$ (Nesa glass), or the like is generally used as an anode. Such a transparent electrode has a high volume resistivity, and thus exhibits a high sheet resistance when it is formed into a thin film. Accordingly, in the organic EL lighting panel using the above-described transparent electrode, the wiring resistance increases as the distance from an end of the transparent electrode (a power feed terminal to which electric power is supplied from a power source) increases, i.e., the wiring resistance increases from the end toward the inside (toward the central portion) of the organic EL lighting panel, so that voltage drop is more liable to occur. The voltage drop in the electrode section causes power loss in this section, and at the same time, decreases the luminance and chromaticity, thereby deteriorating the uniformity in luminance and chromaticity in a plane of an organic EL lighting panel. The above-described decrease in the luminance and chromaticity occurs for the following reason. An organic EL element is an element that emits light utilizing electroluminescence. Owing to the voltage drop, the electric field at the central portion of the element becomes lower than that in the vicinity of the power feed terminal. This lowers the injection efficiency of carriers (holes and electrons), whereby the light emission efficiency is lowered.

Under these circumstances, it has been proposed to provide an auxiliary electrode on a transparent electrode in order to lower the wiring resistance on the transparent electrode side (see Patent Document 1, for example).

CITATION LIST

Patent Document(s)

Patent Document 1: JP 10(1998)-199680 A

BRIEF SUMMARY OF THE INVENTION

Problem to be Solved by the Invention

As the auxiliary electrode, it has been proposed to provide a metal material that can be formed into a film by sputtering or the like and also allows easy patterning, such as Cr or Mo, on a transparent electrode. Cr and Mo are excellent in stability, but they have high volume resistivity. Thus, from the view point of lowering the wiring resistance, they are not sufficiently effective. Also, when an auxiliary electrode is provided on a transparent electrode as disclosed in Patent Document 1, a portion where the auxiliary electrode is provided in an organic EL lighting panel becomes thick. This may cause disconnection, a short circuit, etc., which poses a problem of deteriorated reliability.

With the foregoing in mind, it is an object of the present invention to provide an organic EL lighting panel substrate, an organic EL lighting panel, and an organic EL lighting device, which can improve the uniformity in luminance and chromaticity in an organic EL lighting panel plane and can suppress deterioration in reliability due to disconnection and the like caused by an auxiliary electrode.

Means for Solving Problem

In order to achieve the above object, the present invention provides an organic EL (electroluminescent) lighting panel substrate including: a light-transmitting substrate; and a transparent electrode. The transparent electrode is arranged on one surface of the light-transmitting substrate. The organic EL lighting panel substrate further includes an auxiliary electrode electrically connected to the transparent electrode. The light-transmitting substrate has a groove, and the auxiliary electrode is arranged in the groove of the light-transmitting substrate. The auxiliary electrode is formed of a material having a volume resistivity at 20° C. in the range from $1.59\times10^{-8}$ to $13\times10^{-8}$ $\Omega\cdot m$.

The present invention also provides an organic EL lighting panel including: an organic EL lighting panel substrate; an organic EL layer; and a cathode layer. The organic EL lighting panel substrate is the organic EL lighting panel substrate according to the present invention, and the organic EL layer and the cathode layer are laminated on the transparent electrode in this order.

The present invention also provides an organic EL lighting device including the organic EL lighting panel according to the present invention.

Effects of the Invention

According to the present invention, it is possible to provide an organic EL lighting panel substrate, an organic EL lighting panel, and an organic EL lighting device, which can improve the uniformity in luminance and chromaticity in an organic EL lighting panel plane and can suppress deterioration in reliability due to disconnection and the like caused by an auxiliary electrode.

MODE FOR CARRYING OUT THE INVENTION

Figure 1:
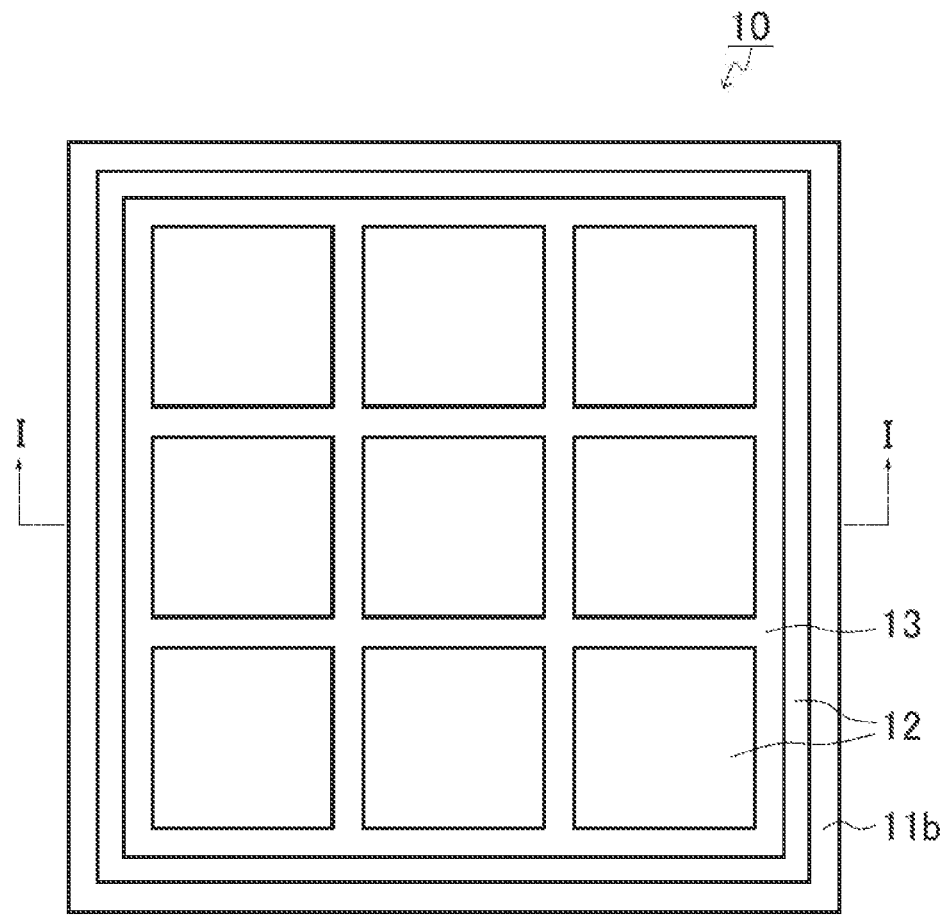
FIG. 1(a) is a plan view showing the structure of an example of the organic EL lighting panel substrate according to the present invention (Embodiment 1).
FIG. 1(b) is a sectional view of the organic EL lighting panel substrate, viewed along arrows I-I in FIG. 1(a).
Figure 1:
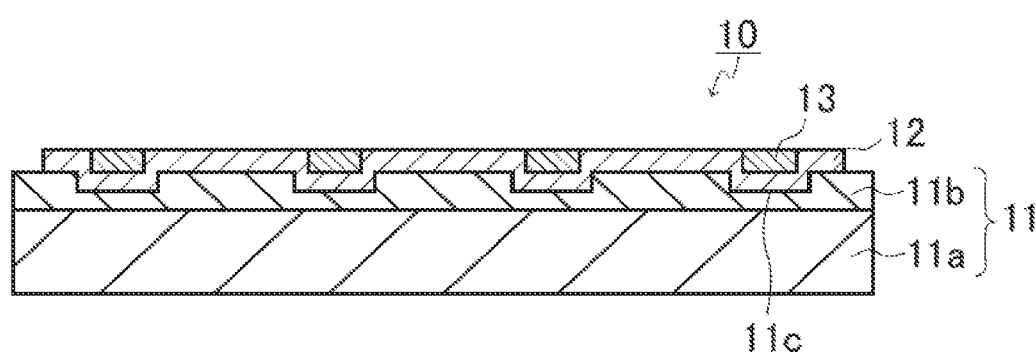

In the present invention, "the auxiliary electrode is arranged in the groove of the light-transmitting substrate" is not limited to the case where the auxiliary electrode is arranged inside the groove of the light-transmitting substrate but also encompasses, for example, the case where the auxiliary electrode is arranged above the groove of the light-transmitting substrate.

The organic EL lighting panel substrate, the organic EL lighting panel, and the organic EL lighting device according to the present invention will be described specifically below with reference to the accompanying drawings. It is to be noted, however, that the present invention is by no means limited to the following embodiments. In FIGS. 1 to 15 to be described below, the same components are given the same reference numerals, and duplicate explanations thereof may be omitted. In the drawings, the structure of each component may be shown in an simplified form as appropriate for the sake of convenience in illustration, and also, each component may be shown schematically with a dimension ratio and the like that are different from the actual dimension ratio and the like.

Embodiment 1

An organic EL lighting panel substrate of the present embodiment is an example of the organic EL lighting panel substrate according to the present invention configured so that the light-transmitting substrate has a multi-layered structure with a layer having a groove (hereinafter also may be referred to as "groove layer") being arranged on an outermost surface of a planar layer (hereinafter also may be referred to as "flat layer"), and the auxiliary electrode is arranged in the groove. FIG. 1 shows the structure of the organic EL lighting panel substrate of the present embodiment. FIG. 1(a) is a plan view of the organic EL lighting panel substrate of the present embodiment. FIG. 1(b) is a sectional view of the organic EL lighting panel substrate, viewed along arrows I-I in FIG. 1(a).

As shown in FIG. 1, the organic EL lighting panel substrate 10 of the present embodiment includes, as main components, a light-transmitting substrate 11, a transparent electrode 12, and an auxiliary electrode 13. The light-transmitting substrate 11 includes: a flat layer 11a; and a groove layer 11b laminated thereon. On a surface of the groove layer 11b on the side opposite to the flat layer 11a, a groove 11c (cross section: rectangular) is provided so as to form a grid pattern. In the groove 11c of the groove layer 11b, the transparent electrode 12 and the auxiliary electrode 13 are arranged in this order from the light-transmitting substrate 11 side. More specifically, on the surface of the groove layer 11b on which the groove 11c is provided, the transparent electrode 12 is arranged on both portions provided with and not provided with the groove 11c. In the transparent electrode 12, portions provided in the groove 11c are recessed so as to form a grid pattern corresponding to the grid pattern of the groove 11c. Further, the auxiliary electrode 13 is arranged above the groove 11c of the groove layer 11b, i.e., in the groove of the transparent electrode 12. The transparent electrode 12 and the auxiliary electrode 13 are electrically connected to each other. The height of the surface of the transparent electrode 12 excluding the groove is substantially the same as the height of the surface of the auxiliary electrode 13.

The flat layer 11a is a substrate having a light-transmitting property, for example. The material forming the flat layer 11a may be an inorganic material or an organic material, for example. Examples of the inorganic material include alkali-free glass, soda-lime glass, borosilicate glass, aluminosilicate glass, and quartz glass. Examples of the organic material include; polyester resins such as polyethylene naphthalate and polyethylene terephthalate; acrylic resins such as ethyl methacrylate, methyl methacrylate, ethyl acrylate, and methyl acrylate; alicyclic olefin resins such as a copolymer of norbornene and ethylene: polyether sulfone; and triacetyl cellulose. The thickness of the flat layer 11a is not particularly limited, and can be set as appropriate depending on the material forming the flat layer 11a, environment in which the flat layer 11a is used, and the like, for example.

The groove layer 11b can be formed of, for example, a resin having a light-transmitting property such as, for example, a light-transmitting polymeric material. It is preferable that the groove layer 11b formed of a light-transmitting polymeric material has a refractive index that is not lower than the refractive index of the flat layer 11a and not higher than the refractive index of the transparent electrode 12. It is more preferable that the refractive index of the groove layer 11b is in the range from 1.5 to 1.9. When the flat layer 11a is an alkali-free glass substrate (refractive index: 1.5) and the transparent electrode 12 is formed of ITO (refractive index: 1.8), the refractive index of the groove layer 11b preferably is from 1.6 to 1.7. In a conventional organic EL lighting panel, the difference in refractive index between a light-transmitting substrate (e.g., alkali-tree glass) and a transparent electrode film is great. Thus, when light travels to the light-transmitting substrate having a lower refractive index from an organic EL layer and the transparent electrode each having a higher refractive index, light incident on the interface between the transparent electrode and the light-transmitting substrate at an angle equal to or greater than the critical angle is totally reflected, so that it cannot exit to the outside of the panel. As a result, the conventional organic EL lighting panel exhibits low light emission efficiency relative to an input power. On this account, for example, as described above, by arranging the groove layer 11b having a refractive index that is intermediate between the refractive index of the flat layer 11a and the refractive index of the transparent electrode 12 between the flat layer 11a and the transparent electrode 12, i.e., by arranging the transparent electrode 12 on the groove layer 11b, it is possible to improve the efficiency of extracting light emitted inside the organic EL lighting panel to the outside of the panel by controlling the critical angle. As a result, the light emission efficiency relative to an input power can be improved.

When the groove layer 11b is formed of a light-transmitting polymeric material, for example, the cross-sectional shape of the groove 11c can be formed easily into various kinds of shape. Because the processing of the cross-sectional shape can be performed easily, the degrees of freedom in wiring pattern (the degrees of freedom in design) also can be increased. This configuration also is preferable because, even when the flat layer 11a is formed, of glass or the like, the groove can be formed without processing the flat layer 11a, so that a processing step such as dry etching or wet etching and chemical solutions etc. required for such a processing step are not necessary, and also no influence is given to the strength (breakage or the like) of the flat layer 11a, for example. Moreover, because the processing can be achieved easily, it is also possible to make an auxiliary wiring to be embedded therein thinner, thereby improving the aperture ratio, for example.

Examples of the light-transmitting polymeric material include thiourethane resins, polycarbonate, polyester methacrylate, urethane methacrylate, epoxy methacrylate, polyester acrylate, urethane acrylate, epoxy acrylate, diallyl carbonate, episulphide resins, PET (polyethylene terephthalate), and TAG (triacetyl cellulose).

In the organic EL lighting panel substrate 10, when the flat layer 11a is formed of an inorganic material such as glass, an adhesion aid such as a silane coupling agent may be used in order to improve the adhesion between the flat layer 11a and the groove layer 11b, for example.

The groove 11c of the groove layer 11b can be formed by, for example: stamping such as pressing or imprinting; photolithography performed by sensitizing the light-transmitting polymeric material; laser processing; or mechanical processing such as fine processing, cutting, or the like with a blade. When the light-transmitting polymeric material is a thermoplastic material, for example, the groove 11c can be formed into various patterns easily by stamping such as pressing or imprinting. The shape of the pattern of the groove 11c can be set as appropriate depending on, for example, the shape of the pattern of the auxiliary electrode 13, and the like. The depth of the groove 11c can be set as appropriate depending on, for example, the thickness of the auxiliary electrode 13, the thicknesses of the transparent electrode 12, and the like.

In the organic EL lighting panel substrate 10, the light-transmitting substrate 11 includes one flat layer 11a and one groove layer 11b. It is to be noted, however, that the present invention is not limited to this example. For example, the flat layer may include a plurality of layers, and the groove layer may be provided on an outermost surface of the laminate of the plurality of layers.

The transparent electrode 12 can be formed by, for example, forming a transparent conductive thin film by a conventionally known method such as sputtering or the like. Examples of the material forming the transparent conductive thin film include ITO, ZnO, IZO (registered trademark, indium-zinc oxide), IGZO (indium-gallium-zinc oxide), GZO (gallium-zinc oxide), and $SnO_2$.

The auxiliary electrode 13 is a low-resistance electrode formed of a material having a volume resistivity at 20° C. in the range from $1.59 \times 10^{-8}$ to $13 \times 10^{-8}$ Ω·m. The lower limit of the volume resistivity "$1.59 \times 10^{-8}$ Ω·m" is the resistance of Ag (silver) as a material having the lowest resistance. This auxiliary electrode 13 is electrically connected to the transparent electrode 12 by being arranged in the groove of the transparent electrode 12. This auxiliary electrode 13 is provided so as to form a grid pattern in a plane of the organic EL lighting panel substrate 10. Thus, when an organic EL lighting panel is configured so as to include the organic EL lighting panel substrate 10, the wiring resistance on the transparent electrode 12 side can be lowered, whereby the uniformity in luminance and chromaticity in an organic EL lighting panel plane can be improved. The pattern of the auxiliary electrode is not limited to the grid pattern, and any pattern may be employed as long as the wiring resistance on the transparent electrode side can be lowered.

Furthermore, in the organic EL lighting panel substrate 10, the bottom surface and all the side surfaces of the auxiliary electrode 13 are electrically connected to the transparent electrode 12. With this configuration, for example, it is possible to maximize the effect of lowering the wiring resistance on the transparent electrode side by the auxiliary electrode and to minimize the contact resistance. In the present invention, it is only necessary that the auxiliary electrode is electrically connected to the transparent electrode, and the form of the electrical connection is not limited to the one described above.

The material forming the auxiliary electrode 13 is a material having a volume resistivity in the above-described range, and specific examples thereof include Cu (copper), Al (aluminum), Ag (silver), Au (gold), Mo (molybdenum), W (tungsten), Ni (nickel), and alloys thereof. Examples of the alloys include Al—Mo (aluminum-molybdenum), Al—Nd (aluminum-neodymium), and Al—Ni (aluminum-nickel). Among them, Cu is particularly preferable. The volume resistivity of the material preferably is in the range from $1.59 \times 10^{-8}$ to $7 \times 10^{-8}$ Ω·m, more preferably from $1.59 \times 10^{-8}$ to $3 \times 10^{-8}$ Ω·m at 20° C. For example, JP 2005-50552 A etc. disclose Cr (chromium) or Mo (molybdenum) as the material forming an auxiliary electrode. Cr and Mo are very stable and highly reliable, and they are used commonly as the material of an auxiliary electrode. However, these materials have high volume resistivity (for example, the volume resistivity of Cr is 7.47 times that of Cu, and the volume resistivity of Mo is 3.12 times that of Cu). Thus, auxiliary electrodes formed using these materials are less effective in lowering the wiring resistance on the transparent electrode side. Moreover, it never can be said that using Cr or the like alone is preferable from an environmental perspective.

As described, above, a particularly preferable material for forming the auxiliary electrode 13 is copper. It is to be noted, however, that the present invention is not limited thereto, and for example, Al or Ag also can be used as a material forming the auxiliary electrode 13, Al and Ag have low resistance, similarly to Cu (the resistance of Al is 1.65 times that of Cu, and the resistance of Ag is 0.94 times that of Cu). Al and Ag have lower melting points than Cu, and there is a possibility that disconnection may occur owing to migration, corrosion, or the like. Thus, when Al or Ag is used as the material forming the auxiliary electrode, there generally is a risk of deterioration in reliability. However, in the organic EL lighting panel substrate 10 of the present invention, the auxiliary electrode 13 is arranged in the groove lie of the groove layer 11b. In other words, the organic EL lighting panel substrate 10 has an inlay clad structure. Thus, the organic EL lighting panel substrate 10 can exhibit improved resistance to migration, corrosion, and the like that may occur when a material having a low melting point, such as Al or Ag, is used, for example.

The method for forming the auxiliary electrode 13 is not particularly limited, and a conventionally known method can be used as appropriate depending on the material used for forming the auxiliary electrode 13. When copper is used as the material forming the auxiliary electrode 13, the auxiliary electrode 13 using copper can be formed by, for example, plating the transparent electrode 12 (both the groove and portions other than the groove) with copper, and thereafter, removing the copper on the portions other than the groove in the transparent electrode 12 by precision polishing. Heretofore, it is difficult to use copper as an auxiliary electrode, because copper cannot be formed into a film by sputtering or the like and patterning of copper is difficult. However, in the present invention, with the above-described configuration, even a material for which patterning is difficult, such as copper, also can be used as a material forming the auxiliary electrode.

In the organic EL lighting panel substrate 10, the auxiliary electrode 13 is arranged above the groove 11c of the groove layer 11b. Thus, when an organic EL lighting panel is configured so as to include the organic EL, lighting panel substrate 10, the increase in thickness of a portion provided with the auxiliary electrode is suppressed, whereby the occurrence of disconnection, a short circuit, and the like can be prevented. As a result, it is possible to suppress the deterioration in reliability of the organic EL lighting panel, for example.

Furthermore, the organic EL lighting panel substrate 10 is configured so that, as described above, the height of the surface of the transparent electrode 12 excluding the groove is substantially the same as the height of the surface of the auxiliary electrode 13. With this configuration, the increase in thickness of the portion provided with the auxiliary electrode can be suppressed further, whereby the occurrence of disconnection, short circuit, and the like can be prevented more effectively. As a result, it is possible to suppress the deterioration in reliability of the organic EL lighting panel still further.

Figure 2:
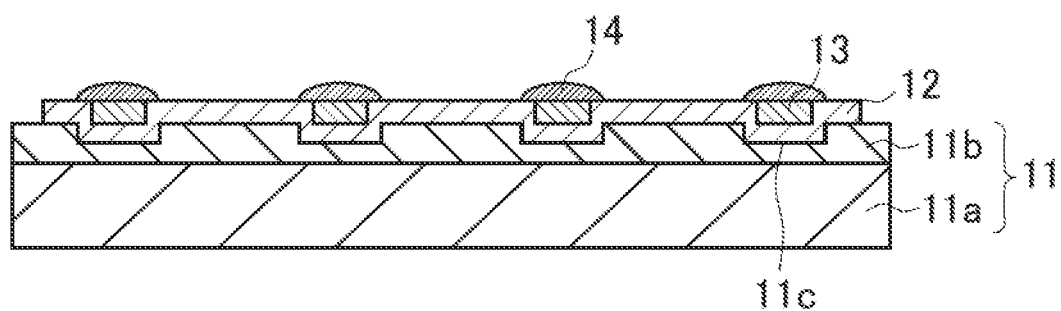
FIG. 2 is a sectional view showing the structure of another example of the organic EL lighting panel substrate of Embodiment 1.

The organic EL lighting panel substrate of the present embodiment may be configured so that, for example, it further includes an insulating member, and the auxiliary electrode is coated with the insulating member. The sectional view of FIG. 2 shows an example of this configuration. As shown in FIG. 2, the organic EL lighting panel substrate of this example has the same configuration as the organic EL lighting panel substrate 10 shown in FIG. 1, except that it further includes an insulating member 14, and portions of the auxiliary electrode 13 other than the contact portions with the transparent electrode 12 are coated with the insulating member 14.

The insulating member 14 has a function of preventing diffusion of the auxiliary electrode 13. Also, when the organic EL lighting panel substrate is used in an organic EL lighting panel, the insulating member 14 exhibits a function of insulating the auxiliary electrode from an organic EL layer and a cathode formed on the auxiliary electrode. In a conventional organic EL lighting panel, an auxiliary electrode is coated with a photoresist material or the like, for example. In this case, however, the total thickness of the auxiliary electrode and an insulating member reaches about 2 µm, for example. On the other hand, the thickness of an organic EL layer is about 300 nm, for example. As described above, the auxiliary electrode and the insulating member are much thicker than the organic EL layer. In the organic EL lighting panel, the organic EL layer and the cathode are formed on the auxiliary electrode coated with this insulating member. Thus, from the aspect of step coverage, rupture (disconnection) may occur in the organic EL layer and the like owing to the thickness of the auxiliary electrode and the thickness of the insulating member, so that the reliability of the organic EL lighting panel may be deteriorated by a short circuit or the like, in contrast, similarly to the organic EL lighting panel substrate 10 shown in FIG. 1, the organic EL lighting panel substrate of this example is configured so that the auxiliary electrode 13 is arranged above the groove 11c of the groove layer 11b. Thus, it is possible to reduce the total thickness of the auxiliary electrode 13 and the insulating member 14. That is, in the organic EL lighting panel substrate of this example, it is possible to reduce the difference between the surface height of the portions where the auxiliary electrode 13 and the insulating member 14 are not arranged, and the surface height of the portion where the auxiliary electrode 13 and the insulating member 14 are arranged. As a result, it is possible to suppress the deterioration in reliability of the organic EL lighting panel caused by the auxiliary electrode and the insulating member, for example.

The material forming the insulating member 14 may be an inorganic material, a polymeric material, or the like, for example. The inorganic material may be an inorganic oxide, an inorganic nitride, or the like, for example. Examples of the inorganic oxide and the inorganic nitride include $SiN_x$, $SiO_xN_y$, and $SiO_x$. Examples of the polymeric material include acrylic, novolac, and polyimide photosensitive polymeric materials. Among them, inorganic materials are particularly preferable. As the insulating member 14, it is possible to use an inorganic oxide film, an inorganic nitride film, or the like. Examples of the method for forming the insulating member 14 include vacuum deposition and CVD that are carried out using the above-described forming material. Patterning of the insulating member 14 (in this example, patterning into a grid pattern) can be performed, for example, with, the use of a shadow mask or by a process using photoetching and photolithography. The thickness of the insulating member 14 formed of the polymeric material is about 500 nm to 1 µm, for example. In contrast, the thickness of the insulating member 14 formed of the inorganic material is about 100 to 300 nm, for example. Thus, when the insulating member 14 is formed of the inorganic material, the insulating member 14 can be made thinner as compared with the case where the insulating member 14 is formed of the polymeric material. Accordingly, it is possible to further reduce the possibility of malfunctions such as disconnection and a short circuit, for example.

When the insulating member is formed of the polymeric material, the polymeric material may contain a very small amount of moisture, a solvent, or the like in its molecules. This may cause a malfunction such as the generation of a dark spot. Such a malfunction can be avoided if the insulating member is formed of the inorganic material. Also, in the case where the inorganic material is used, it is possible to make the insulating member finer as compared with the case where the polymeric material is used, for example. Thus, it is possible to improve the aperture ratio in the organic EL lighting panel, for example.

When the insulating member is formed of the polymeric material, the insulating member can be formed, merely by performing photolithography steps without performing photoetching steps, for example. Thus, it is possible to reduce the burden of the process steps.

Figure 3:
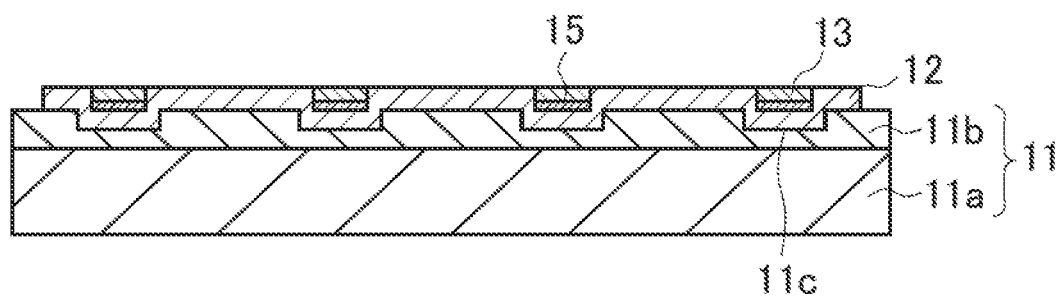
FIG. 3 is a sectional view showing the structure of still another example of the organic EL lighting panel substrate of Embodiment 1.

The organic EL lighting panel substrate of the present embodiment may be configured so that, for example, it further includes a reflective layer that reflects visible light, and the reflective layer is arranged between the transparent electrode and the auxiliary electrode. The sectional view of FIG. 3 shows an example of this configuration. As shown in FIG. 3, the organic EL lighting panel substrate of this example has the same configuration as the organic EL lighting panel substrate 10 shown in FIG. 1, except that it further includes a reflective layer 15, and the reflective layer 15 is arranged between the transparent electrode 12 and the auxiliary electrode 13.

With this configuration, the following effects can be obtained, for example. Specifically, in the organic EL lighting panel using the organic EL lighting panel substrate of this example, light emitted from the organic EL layer and then passes through the transparent electrode 12 may be totally reflected at the interface between the transparent electrode 12 and the light-transmitting substrate 11, depending on the incident angle to the light-transmitting substrate 11. This totally reflected light passes through the transparent electrode 12 and then is incident on the auxiliary electrode 13. For example, when the auxiliary electrode 13 is formed of copper or the like, the auxiliary electrode 13 absorbs light components in a specific wavelength region out of the incident light, so that the auxiliary electrode 13 is colored. However, if the reflective layer 15 that reflects visible light is arranged between the transparent electrode 12 and the auxiliary electrode 13 as described above, the light reflected at the interface between the transparent electrode 12 and the light-transmitting substrate 11 is reflected by the reflective layer 15, so that the light can be emitted to the outside of the panel, for example. As a result, the light extraction efficiency can be improved.

It is preferable that the reflective layer 15 exhibits high reflectance over the entire visible light region. Such a reflective layer 15 may be, for example, a thin film or diffusion reflective film formed of Ag, Al, Ti, or the like. Even if the reflective layer 15 is formed of Ag, Al, or the like, because the reflective layer 15 is provided in the groove of the transparent electrode 12 (an inlay clad structure), it is possible to prevent malfunctions caused by migration, corrosion, and the like, for example.

The organic EL lighting panel substrate configured so as to include the above-described reflective layer also is applicable to the case where light is extracted from the side opposite to the substrate (a top emission system) and to the case where light is extracted from both sides using a transparent organic EL layer. In these cases, the transparent electrode, the auxiliary-electrode, and the reflective layer are arranged in this order from the light-transmitting substrate side.

Embodiment 2

Figure 4:
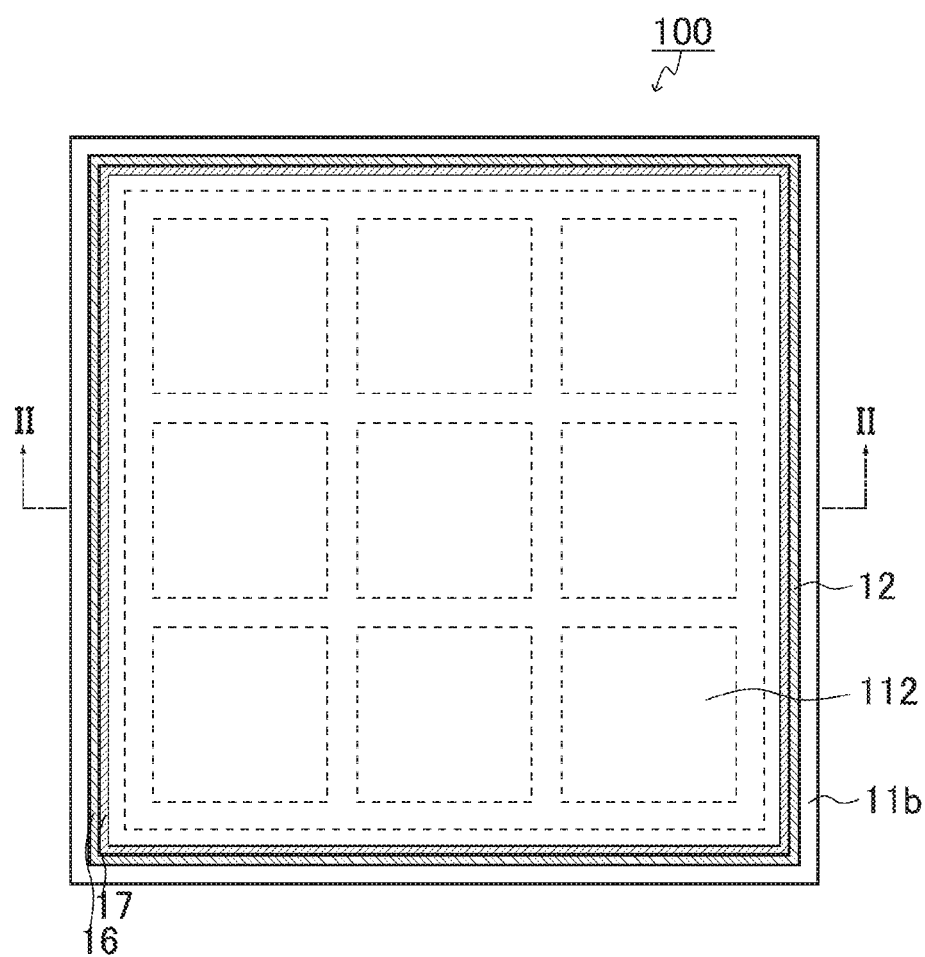
FIG. 4(a) is a plan view showing the structure of an example of the organic EL lighting panel according to the present invention (Embodiment 2).
FIG. 4(b) is a sectional view of the organic EL lighting panel, viewed along arrows II-II in FIG. 4(a).
Figure 4:
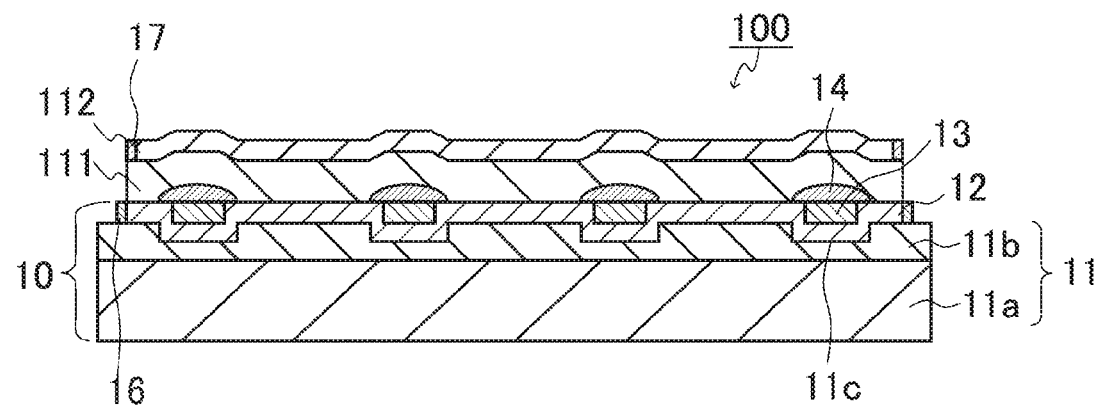

An organic EL lighting panel of the present embodiment is an example of an organic EL lighting panel that includes the organic EL lighting panel substrate 10 of Embodiment 1 shown in FIG. 1. FIG. 4 shows the structure of the organic EL lighting panel of the present embodiment. FIG. 4(a) is a plan view of the organic EL lighting panel of the present embodiment. FIG. 4(b) is a sectional view of the organic EL lighting panel, viewed along arrows II-II in FIG. 4(a).

As shown in FIG. 4, the organic EL lighting panel 100 of the present embodiment includes, as main components, the organic EL lighting panel substrate 10, an organic EL layer 111, and a cathode layer 112. In the organic EL lighting panel substrate 10, portions of the auxiliary electrode 13 other than the contact portions with the transparent electrode 12 are coated with the insulating member 14. On the transparent electrode 12 and the insulating member 14, the organic EL layer 111 and the cathode layer 112 are laminated in this order. Because the organic EL lighting panel substrate 10 shown in FIG. 1 is used in the organic EL lighting panel 100, it is possible to obtain the effects described above with regard to the organic EL lighting panel substrate 10 shown in FIG. 1. It is also possible to obtain the effects described above with regard to the organic EL lighting panel substrate shown in FIG. 2 (the organic EL lighting panel substrate including the insulating member).

The light-transmitting substrate 11, the flat layer 11a, the groove layer 11b, the transparent electrode 12, and the auxiliary electrode 13 are as described above (the same applies hereinafter). The transparent electrode 12 functions as an anode, for example.

The organic EL layer 111 is configured so that, for example, it includes: a light-emitting layer containing an organic electroluminescent material; a hole transport layer and an electron transport layer that sandwich the light-emitting layer; and further, e.g., a hole injection layer and an electron injection layer that sandwich the hole transport layer and the electron transport layer. The organic EL layer 111 further may include, for example, a carrier block layer that blocks holes or electrons to improve the light emission efficiency. The organic EL layer 111 is, for example, a laminate including the hole injection layer, the hole transport layer, the light-emitting layer, the electron transport layer, and the n electron injection layer laminated in this order from the transparent electrode 12 side.

The hole injection layer is provided in order to lower the height of an injection barrier with respect to holes injected from the transparent electrode 12 (anode) to the organic EL layer 111, and to reduce the difference in energy level between the anode and the hole transport layer so as to allow the holes injected from the anode to be easily injected to the hole transport layer. The hole injection layer is formed of a hole injection layer material. The material forming the hole injection layer may be, for example, an organic hole injection material, and specific examples thereof include copper phthalocyanine and arylamine derivatives such as star-burst type aromatic amines. In order to further lower the injection barrier so as to lower the driving voltage, the organic hole injection material may be chemically doped with an inorganic substance such as vanadium pentoxide or molybdenum trioxide or an organic substance such as F4-TCNQ, for example.

The hole transport layer preferably is formed of a hole transport layer material. The hole transport layer material is a material that has an appropriate ionization potential to enhance the mobility of holes to the light-emitting layer, and at the same time, has an electron affinity to prevent electron leakage from the light-emitting layer. Specific examples of the hole transport layer material include triphenyldiamines and star-burst type aromatic amine. Examples of the triphenyldiamines include bis(di(p-tolyl)aminophenyl)-1,1-cyclohexane, 4,4'-bis(m-tolylphenylamino)biphenyl (TPD), and N,N'-diphenyl-N—N-bis(1-naphthyl)-1,1'-biphenyl)-4,4'-diamine (α-NPD).

The light-emitting layer is a layer that emits fluorescence, phosphorescence, or the like by recombination of electrons injected from the electrode with holes. The light-emitting layer contains a light-emitting material. Examples of the light-emitting material include: low molecular weight compounds such as tris(8-quinolinol) aluminum complex ($Alq_3$), bisdiphenylvinylbiphenyl (BDPVBi), 1,3-bis(p-t-butylphenyl-1,3,4-oxadiazolyl)phenyl (OXD-7), N,N'-bis(2,5-di-t-butylphenyl) perylenetetracarboxylic acid diimide (BPPC), and 1,4-bis(N-p-tolyl-N-4-(4-methylstyryl)phenylamino) naphthalene; and high molecular weight compounds such as polyphenylene vinylene polymers.

The light-emitting material also may be, for example, a two-component material containing a host and a dopant, in which energy in the excited state generated by host molecules migrates to dopant molecules, and the dopant molecules emits light. Examples of such a light-emitting material include the above-described light-emitting materials, electron transport layer materials to be described, below, and the above-described hole transport layer materials. Specifically, the light-emitting material may be, for example: a material obtained by doping a quinolinol metal complex such as $Alq_3$ as a host with 4-dicyanomethylene-2-methyl-6-(p-dimethylaminostyryl)-4H-pyran (DCM), a quinacridone derivative such as 2,3-quinacridone, or a coumarin derivative such as 3-(2'-benzothiazole)-7-diethylaminocoumarin as a dopant; a material obtained by doping a bis(2-methyl-8-hydroxyquinoline)-4-phenylphenol-aluminum complex, which is an electron transport material as a host, with a fused polycyclic aromatic compound such as perylene as a dopant; a material obtained by doping 4,4'-bis(m-tolylphenylamino)biphenyl (TPD), which is a hole transport layer material as a host, with rubrene or the like as a dopant; or a material obtained by doping a carbazole compound such as 4,4'-biscarbazolylbiphenyl (CBP) or 4,4'-bis(9-carbazolyl)-2,2'-dimethylbiphenyl (CDBP) as a host with a platinum complex or an iridium complex such as tris-(2-phenylpyridine) iridium complex ($Ir(ppy)_3$), (bis(4,6-difluorophenyl)-pyridinato-N,C2') picolinate iridium complex (FIr(pic)), (bis(2-(2'-benzo(4,5-α)thienyl)pyridinato-N,C2') (acetylacetonato) iridium complex ($Btp_2Ir(acac)$), $Ir(pic)_3$, or $Bt_2Ir(acac)$ as a dopant.

The above-described light-emitting material can be selected as appropriate depending on the color of light emission to be obtained, by the organic EL lighting panel, for example. Specifically, for example, in the case where green light emission is to be obtained, $Alq_3$ and a dopant such as quinacridone, coumarin, or $Ir(ppy)_3$ can be selected. In the case where blue light emission is to be obtained, DPVBi and a dopant such as perylene, a distyrylarylene derivative, or FIr(pic) can be selected. In the case where green to blue-green light emission is to be obtained, OXD-7 or the like can be selected. In the case where red to orange light emission is to be obtained, a dopant such as DCM, DCJTB, or $Ir(pic)_3$ can be selected. In the case where yellow light emission is to be obtained, a dopant such as rubrene or $Bt_2Ir(acac)$ can be selected. When white light emission is to be obtained, the light emission material containing $Alq_3$ or the like as a host and DCM (orange) or the like as a guest can be selected, for example.

The light-emitting layer for white light emission may have, for example, a three-layer laminated structure including layers containing light-emitting materials for light emission of red, green, and blue, respectively. Other examples of the light-emitting layer for white light emission include: a layer having a two-layer laminated structure including layers containing light-emitting materials for light emission of complementary colors such as blue and yellow; and a layer having a single layer structure containing light-emitting materials of these colors, obtained by forming these light-emitting materials into a film by multi-component codeposition or the like. The light-emitting layer for white light also may be a layer formed by providing light-emitting materials contained in the respective color layers in the above-described layer having the three-layer or two-layer laminated structure in the form of fine pixels of red, blue, green, and the like arranged two-dimensionally in sequence, for example.

The electron transport layer preferably is formed of an electron transport layer material. The electron transport layer material is a material that has an appropriate ionization potential to enhance the mobility of electrons to the light-emitting layer, and at the same time, has an electron affinity to prevent hole leakage from the light-emitting layer. Specific examples of the electron transport layer material include organic materials such as: oxadiazole derivatives such as 2-(4-biphenylyl)-5-(4-t-butylphenyl)-1,3,4-oxadiazole (Bu-PBD) and OXD-7; triazole derivatives; and quinolinol metal complexes. The electron transport layer material may be obtained by chemically doping the above-described organic material with an electron-donating substance like an alkali metal such as lithium, for example.

The electron injection layer is provided in order to alleviate a problem in that, for example, injection of electrons from the cathode layer to the electron transport layer becomes difficult owing to a large difference in energy between the work function of a metal material such as aluminum used for forming the cathode layer and the electron affinity (LUMO level) of the electron transport layer. The electron injection layer preferably is formed of an electron injection layer material. The electron injection layer material may be a material having a small work function. More specifically, such a material may be, for example: a fluoride or an oxide of an alkali metal such as lithium or cesium or an alkaline-earth metal such as calcium; magnesium silver; or a lithium aluminum alloy.

The carrier block layer may be a hole block layer, for example. The hole block layer is provided between the light-emitting layer and the electron transport layer in order to blocks holes that pass through the light-emitting layer without contributing to light emission, thereby increasing the recombination probability in the light-emitting layer. Examples of the material forming the hole block layer include 2,9-dimethyl-4,7-diphenyl-1,10-phenanthroline (BCP), triphenyldiamine derivatives, and triazole derivatives.

The thickness of the organic EL layer 111 is not particularly limited. For example, the layers included in the organic EL layer 111 each have a thickness in the range from 1 to 500 nm, and the total thickness of the respective layers is in the range from 100 nm to 1000 nm, for example.

The organic EL layer 111 can be formed by a conventionally known method, for example. For example, when the light-emitting layer is formed of the above-described low molecular weight compound (low molecular weight organic EL material), the light-emitting layer can be formed, by vacuum deposition achieved by resistance heating of the low molecular weight organic EL material, for example. For example, when the light-emitting layer is formed of the above-described high molecular weight compound (high molecular weight organic EL material), the light-emitting layer can be formed by applying the high molecular weight organic EL material by a slit coating method, a flexographic printing method, an Inkjet method, or the like, for example.

The cathode layer 112 is an electrode to be paired with the transparent electrode 12. The cathode layer 112 may or may not have a light-transmitting property, for example. When the cathode layer 112 does not have a light-transmitting property, the cathode layer 112 may be a cathode having a light-shielding property, such as a metal thin film formed of aluminum, silver, or the like, for example. Such an electrode is preferable because, for example, light emitted toward the cathode layer 112 side from the organic EL layer 111 during light emission can be reflected toward the transparent electrode 12 side by the electrode, so that the decrease in the amount of light discharged from a light-emitting surface can be suppressed. The thickness of the cathode layer 112 is not particularly limited. Considering the voltage drop due to the wiring resistance, the cathode layer 112 preferably is thick, and the thickness of the cathode layer 112 can be set in the range from 50 to 300 nm, for example. On the other hand, when the cathode layer 112 has a light-transmitting property, the cathode layer 112 can be formed using the same material as the transparent electrode 12, for example. With the use of such an electrode, it is possible to produce an organic EL element that is transparent when it is in a non-emitting state. The cathode layer 112 can be formed by a conventionally known method, for example. When the cathode layer 112 is formed of a metal such as aluminum, the cathode layer 112 can be formed by vacuum deposition achieved through resistance heating of the metal or by sputtering.

The organic EL lighting panel 100 includes, for example, a power feed contact portion for an anode 16 (hereinafter may be referred to as "anode power feed contact portion") near an end of the transparent electrode 12, and a power feed contact portion for a cathode 17 (hereinafter may be referred to as "cathode power feed contact portion") near an end of the cathode layer 112 (for example, in FIG. 4(a), the ends near the transparent electrode 12 and the cathode layer 112). The anode power feed contact portion 16 and the cathode power feed contact portion 17 preferably are formed of the same material as the auxiliary electrode 13 (a low resistance material). With this configuration, it is possible to suppress the occurrence of electromigration and the like, whereby the deterioration in reliability can be suppressed, for example. Also, because it is possible to lower the contact resistance between each contact portion and the wiring member, the driving voltage can be lowered, which enables further electric power saving and higher efficiency, for example. In the organic EL lighting panel of the present embodiment, in order to provide the anode power feed contact portion 16 and the cathode power feed contact portion 17, one end of each of the transparent electrode and the cathode layer may be extended, for example.

Next, with reference to FIGS. 5A and 5B, the method for producing the organic EL lighting panel 100 will be described taking, as an illustrative example, the case where the transparent electrode 12 is an ITO electrode and the auxiliary electrode 13 is a copper electrode. It is to be noted, however, that the method for producing the organic EL lighting panel 100 is not limited to the following example.

Figure 5A:
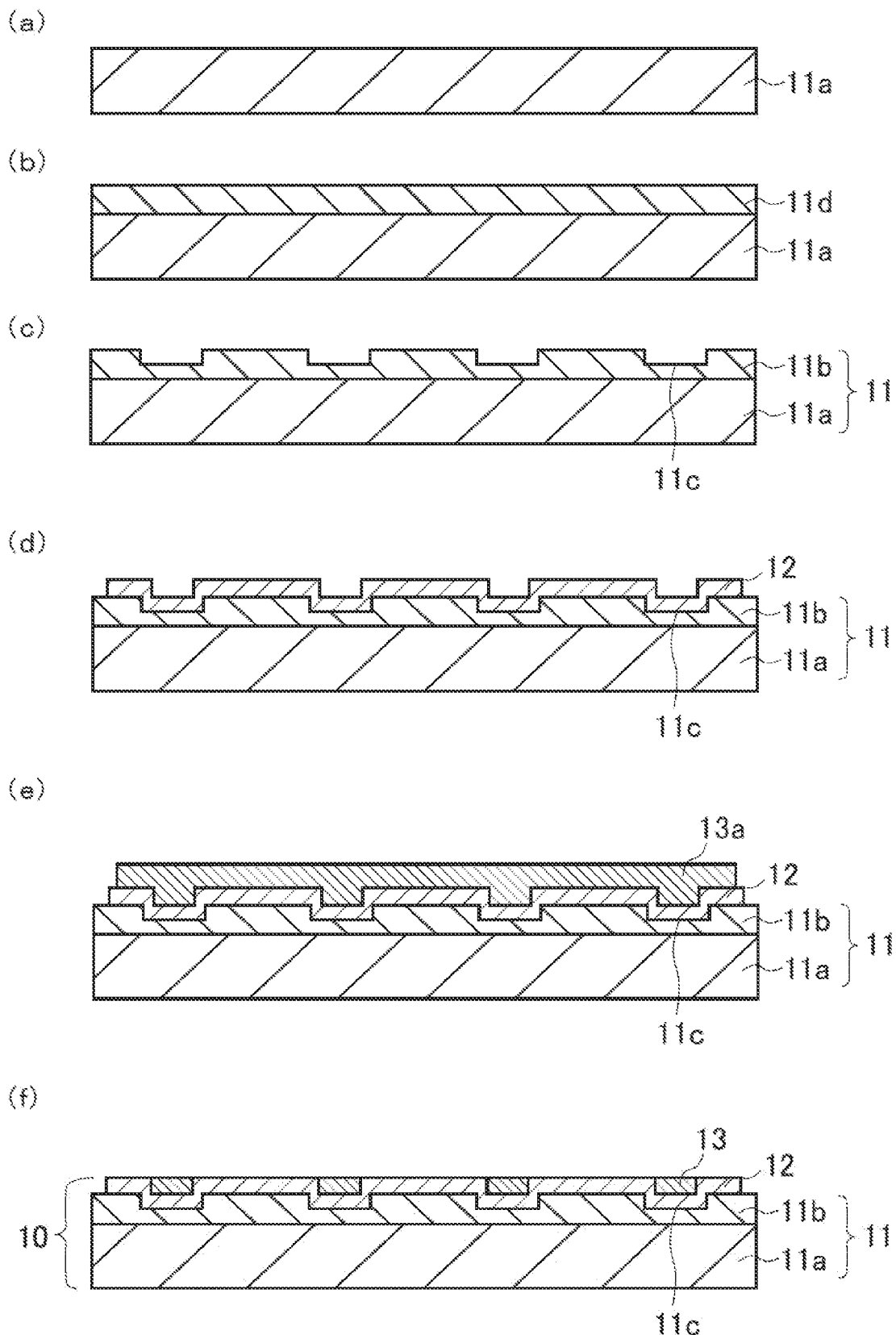
In FIG. 5A, (a) to (f) are sectional views illustrating an example of a method for producing the organic EL lighting panel of Embodiment 2.

First, as shown in (a) in FIG. 5A, a flat layer 11a is provided. Next, as shown in (b) in FIG. 5A, a layer 11d for groove formation is laminate on the flat layer 11a. Specifically, for example, the layer 11d for groove formation is formed by applying the above-described light-transmitting polymeric material onto the flat layer 11a formed of glass or the like by a printing method or the like. In this state, as shown in (c) in FIG. 5A, a groove 11c is formed on the groove formation layer 11d (a groove forming step), thus providing a groove layer 11b. Examples of the method for forming the groove 11c include: stamping such as pressing or imprinting; photolithography performed, by sensitizing the light-transmitting polymeric material; laser processing; and mechanical processing such as fine processing, cutting, or the like with a blade. When the light-transmitting polymeric material is a thermoplastic material, the groove 11c can be formed easily by, for example, stamping such as pressing or imprinting.

Next, as shown in (d) in FIG. 5A, a transparent electrode 12 formed of ITO is formed on both portions provided with and not provided with the groove 11c in the groove layer 11b by sputtering, for example (a transparent electrode arranging step). Next, as shown in (e) in FIG. 5A, a copper thin film layer 13a is formed, by, for example, plating so as to coat the transparent electrode 12. Furthermore, as shown in (f) in FIG. 5A, the copper thin film layer 13a is subjected to precision polishing by, for example, chemical mechanical polishing to remove the copper on portions other than the groove in the transparent electrode 12, whereby an auxiliary electrode 13 formed of copper is formed, in the groove of the transparent electrode 12 (an auxiliary electrode arranging step). In this step, the height of the surface of the auxiliary electrode 13 is adjusted by flattening in order to make the height of the surface of the transparent electrode 12 excluding the groove substantially the same as the height of the surface of the auxiliary electrode 13. In the above-described manner, the organic EL lighting panel substrate 10 shown in FIG. 1 can be produced, for example. It is to be noted, however, that the method for producing the organic EL lighting panel substrate 10 is not limited to this example.

Figure 5B:
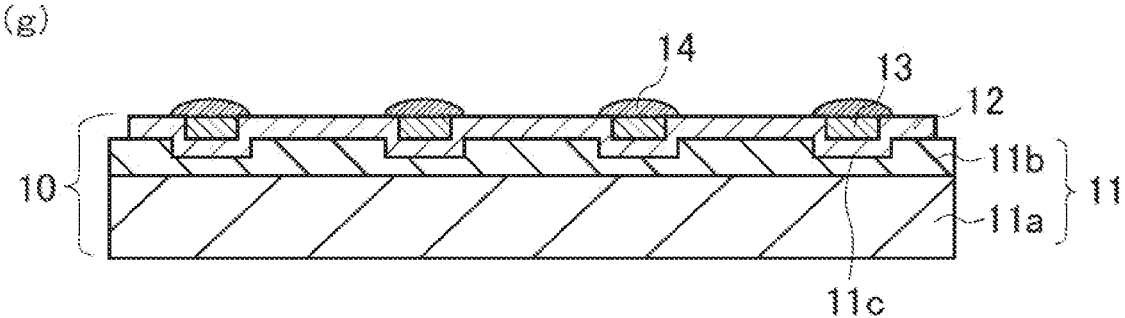
In FIG. 5B, (g) to (i) are sectional views illustrating the example of the method for producing the organic EL lighting panel of Embodiment 2.
Figure 5B:
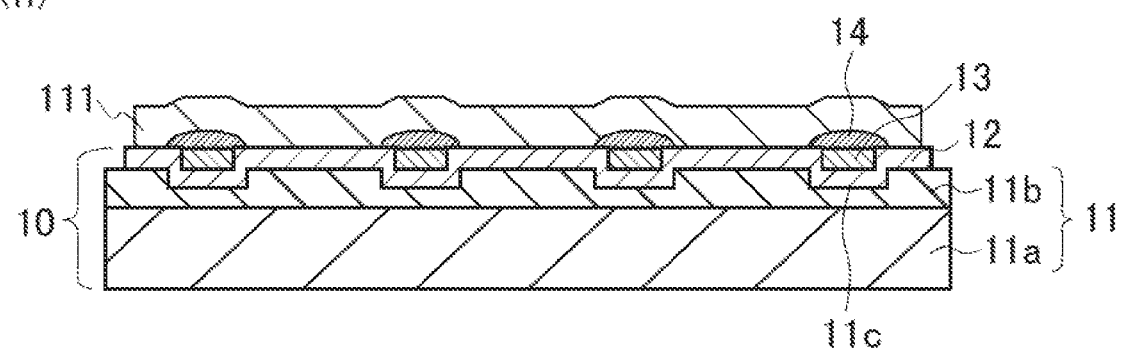
Figure 5B:
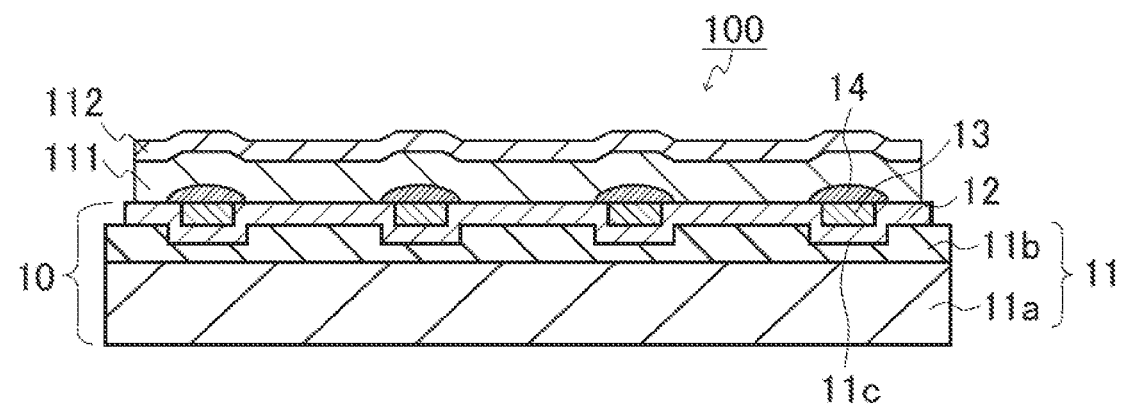
Figure 6:
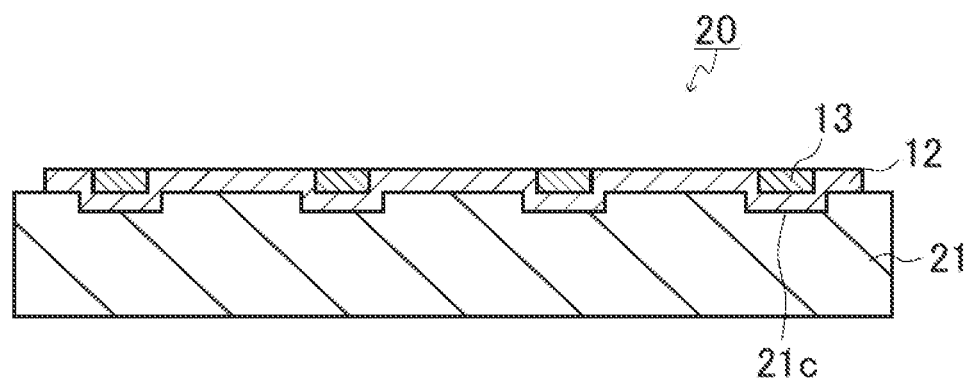
FIG. 6(a) is a sectional view showing the structure of another example of the organic EL lighting panel substrate according to the present invention (Embodiment 3).
FIG. 6(b) is a sectional view showing the structure of another example of the organic EL lighting panel substrate of Embodiment 3.
FIG. 6(c) is a sectional view showing the structure of still another example of the organic EL lighting panel substrate of Embodiment 3.
Figure 6:
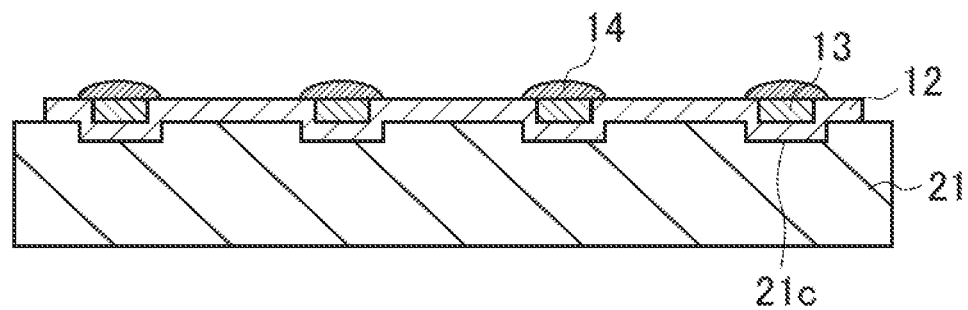
Figure 6:
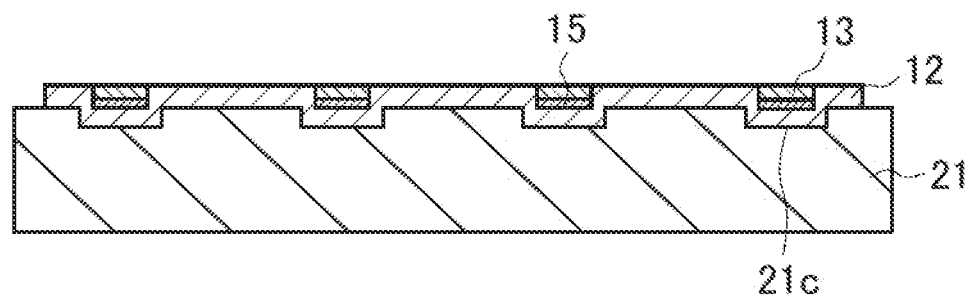
Figure 7:
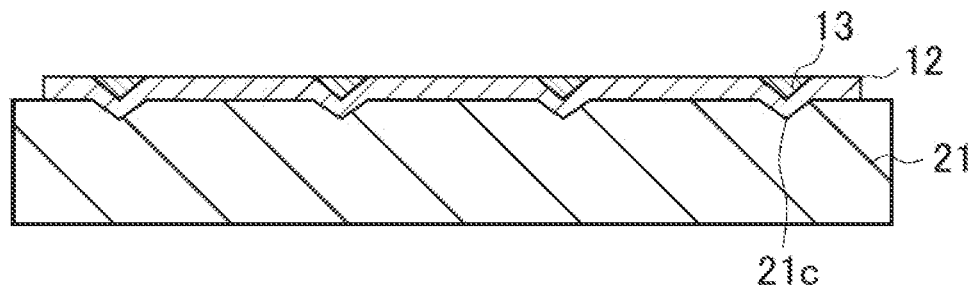
FIG. 7 shows sectional views showing other examples of the cross-sectional shape of an auxiliary electrode in the organic EL lighting panel substrate of Embodiment 3.
Figure 7:
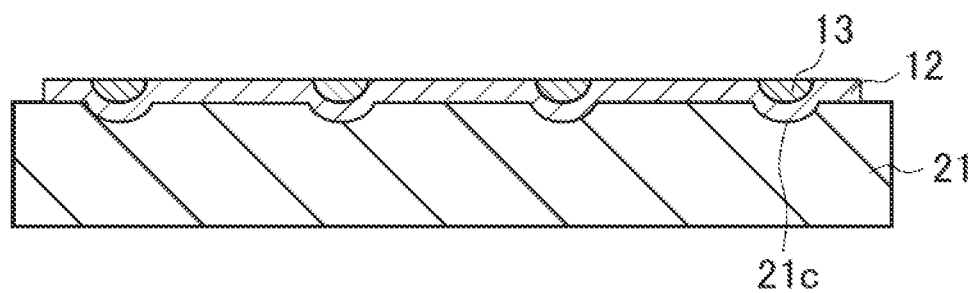

Next, as shown in (g) in FIG. 5B, portions of the auxiliary electrode 13 other than the contact portions with the transparent electrode 12 are coated with an insulating member 14 by photolithography, for example (an insulating member coating step). Next, as shown in (h) in FIG. 5B, an organic EL layer 111 is formed on the transparent electrode 12 and the insulating member 14 by vacuum deposition or the like (an organic EL layer arranging step). The organic EL layer 111 may be a layer having the above-described laminated structure, for example. Finally, as shown in (i) in FIG. 5B, a cathode layer 112 is formed on the organic EL layer 111 by vacuum deposition or the like (a cathode layer arranging step). In the above-described manner, the organic EL lighting panel 100 can be formed. In the production method of the present example, in order to insulate element parts of the organic EL lighting panel from the external environment, the step of sealing the element parts using a conventionally known sealing material may be performed, for example (not shown in FIGS. 5A and 5B).

In the above-described, production method, for example, after the transparent electrode arranging step, a reflective layer that reflects visible light may be formed on the groove of the transparent electrode (a reflective layer arranging step), and then, the auxiliary electrode arranging step may be performed. In this manner, a substrate having the same configuration as the organic EL lighting panel substrate shown in FIG. 3 can be produced, for example.

The organic EL lighting panel 100 is applicable to an organic EL lighting device, a backlight of a liquid crystal display or the like, etc., for example. The organic EL lighting panel 100 preferably is applied, to the organic EL lighting device, the backlight, or the like that requires a large panel size, specifically, a panel size of at least 10 cm×10 cm, for example. The use of the EL lighting panel of the present invention is not limited to those described above, and the EL lighting panel of the present invention is applicable to a wide range of fields.

Embodiment 3

An organic EL lighting panel substrate of the present embodiment is an example of the organic EL lighting panel substrate according to the present invention configured so that a groove is provided in the light-transmitting substrate itself, and the auxiliary electrode is arranged in the groove. FIG. 6(a) shows the structure of the organic EL lighting panel substrate of the present embodiment.

As shown in FIG. 6(a), the organic EL lighting panel substrate 20 of the present embodiment includes, as main components, a light-transmitting substrate 21, a transparent electrode 12, and an auxiliary electrode 13. On one surface of the light-transmitting substrate 21 (the upper surface in FIG. 6(a)), a groove 21c (cross section: rectangular) is provided so as to form the same grid pattern as the groove 11c of the groove layer 11b in the organic EL lighting panel substrate of Embodiment 1. In the groove 21c of the light-transmitting substrate 21, the transparent electrode 12 and the auxiliary electrode 13 are arranged in this order from the light-transmitting substrate 11 side. More specifically, on the surface of the light-transmitting substrate 21 on which the groove 21c is provided, the transparent electrode 12 is arranged on both portions provided with and not provided with the groove 21c. The portion of the transparent electrode 12 provided, in the groove 21c is recessed so as to form a grid pattern corresponding to the grid pattern of the groove 21c. Further, the auxiliary electrode 13 is arranged above the groove 21c of the light-transmitting substrate 21, i.e., in the groove of the transparent electrode 12. The transparent electrode 12 and the auxiliary electrode 13 are electrically connected to each other. The height of the surface of the transparent electrode 12 excluding the groove is substantially the same as the height of the surface of the auxiliary electrode 13. With this configuration, as in the case of the organic EL lighting panel substrate 10 shown in FIG. 1, the above-described effects of the present invention can be obtained.

The light-transmitting substrate 21 is a substrate having a light-transmitting property, and examples of the material forming the light-transmitting substrate 21 include those described in Embodiment 1 as examples of the material forming the flat layer 11a. In the organic EL lighting panel substrate 20, the groove 21c is provided directly in the light-transmitting substrate 21. Thus, it is not necessary to provide a flattened layer on a transparent substrate as described in JP 2005-50552 A etc., for example. Therefore, the organic EL lighting panel substrate of the present invention can be produced more easily than the organic EL substrate discloses in JP 2005-50552 A etc., because the necessity of performing the step of providing the flattened layer is eliminated, for example.

The shape of the pattern of the groove 21c can be set as appropriate depending on the shape of the pattern of the auxiliary electrode 13, etc., for example. The depth of the groove 21c can be set as appropriate depending on the thickness of the auxiliary electrode 13, the thickness of the transparent electrode 12, etc., for example. The groove 21c of the light-transmitting substrate 21 can be formed by, for example, chemically etching and/or modifying the light-transmitting substrate 21 by photoetching. Alternatively, the groove 21c may be formed using a mechanical method such as blade polishing or blasting. In a conventional organic EL lighting panel, the difference in refractive index between a light-transmitting substrate (alkali-free glass) and a transparent electrode is great. Thus, when light travels to the light-transmitting substrate having a lower refractive index from an organic EL layer and the transparent electrode each having a higher refractive index, light incident on the interface between the transparent electrode and the light-transmitting substrate at an angle equal to or greater than the critical angle is totally reflected, so that it cannot exit to the outside of the panel. The respective layers included in the conventional organic EL lighting panel have a parallel plate-type structure. Thus, once light is totally reflected, the reflection angle thereof is retained. Accordingly, the reflected, light is guided along the lateral direction of the organic EL lighting panel while being reflected repeatedly. As a result, the conventional organic EL lighting panel exhibits low light emission efficiency relative to an input power. On this account, by providing the groove 21c in the light-transmitting substrate 21 as described above to provide a three-dimensional structure on the surface of the light-transmitting substrate 21, it is possible to change the reflection angle of light totally reflected at the interface between the transparent electrode 12 and the light-transmitting substrate 21 when the light is reflected by the auxiliary electrode 13. Moreover, when light from the organic EL layer is incident on the light-transmitting substrate 21 having the three-dimensional structure, the incident angle is changed at the three-dimensional structure part, so that it is also possible to reduce total reflection at the interface between the light-transmitting substrate and the transparent electrode. As a result, it is possible to improve the efficiency of extracting light emitted inside the organic EL lighting panel to the outside of the panel, for example.

In the organic EL lighting panel substrate of the present embodiment, the three-dimensional structure (the cross-sectional shape) on the surface of the light-transmitting substrate, i.e., the three-dimensional structure (the cross-sectional shape) of the auxiliary electrode may be as follows, for example: as shown in FIG. 7(a), the cross-sectional shape of the groove 21c (the cross-sectional shape of the auxiliary electrode 13) is triangular; or as shown in FIG. 7(b), the cross-sectional shape of the groove 21c (the cross-sectional shape of the auxiliary electrode 13) is semicircular. With such a cross-sectional shape, it is possible to reflect light more efficiently, for example. It is to be noted, however, that the present invention is not limited to this example. Also, for example, by changing the incident angle of light incident on the light-transmitting substrate from the organic EL layer and the transparent electrode, the critical angle also is changed, which also can be expected to contribute to the improvement in light extraction efficiency. Furthermore, with regard, to light that is totally reflected at the interface between the light-transmitting substrate and the air owing to the difference in refractive index to return to the light-transmitting substrate, the incident angle and the reflection angle also is changed at the auxiliary electrode part so as to allow the light to be emitted into the air. Thus, the light extraction efficiency can be improved. As a result, for example, the light emission efficiency relative to an input power can be improved.

As in the case of the organic EL lighting panel substrate of Embodiment 1, the organic EL lighting panel substrate of the present embodiment may be configured so that, for example, it further includes an insulating member, and the auxiliary electrode is coated with the insulating-member. The sectional view of FIG. 6(b) shows an example of this configuration. As shown in FIG. 6(b), the organic EL lighting panel substrate of this example has the same configuration as the organic EL lighting panel substrate 20, except that it further includes an insulating member 14, and portions of the auxiliary electrode 13 other than the contact portions with the transparent electrode 12 are coated with the insulating member 14. With this configuration, it is possible to obtain the same effects as those described, above with regard, to the organic EL lighting panel substrate shown in FIG. 2 (the organic EL lighting panel substrate including the insulating member).

As in the case of the organic EL lighting panel substrate of Embodiment 1, the organic EL lighting panel substrate of the present embodiment may be configured so that, for example, it further includes a reflective layer that reflects visible light, and the reflective layer is arranged between the transparent electrode and the auxiliary electrode. The sectional view of FIG. 6(c) shows an example of this configuration. As shown in FIG. 6(c), the organic EL lighting panel substrate of this example has the same configuration as the organic EL lighting panel substrate 20, except that it further includes a reflective layer 15, and the reflective layer 15 is arranged between the transparent electrode 12 and the auxiliary electrode 13. With this configuration, it is possible to obtain the same effects as those described above with regard to the organic EL lighting panel substrate shown in FIG. 3 (the organic EL lighting panel substrate including the reflective layer).

Embodiment 4

Figure 8:
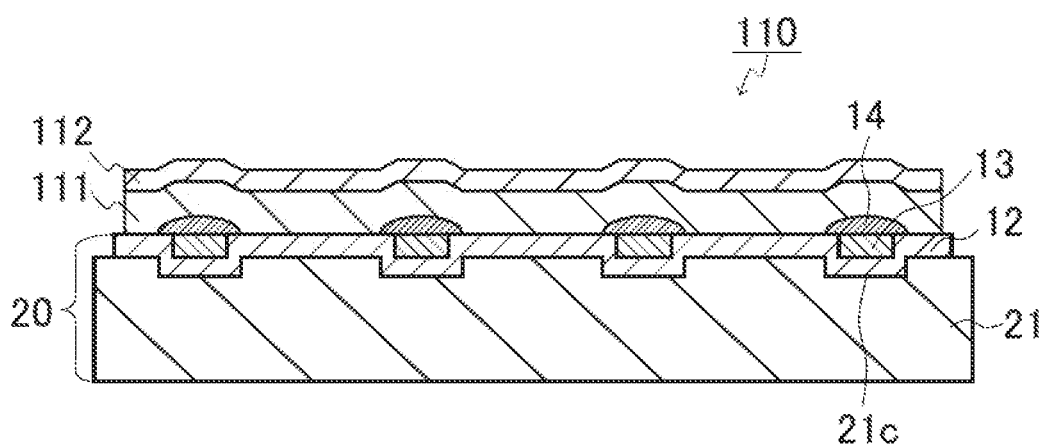
FIG. 8 is a sectional view showing the structure of another example of the organic EL lighting panel according to the present invention (Embodiment 4).

An organic EL lighting panel of the present embodiment is an example of an organic EL lighting panel that includes the organic EL lighting panel substrate 20 shown in FIG. 6(a). The sectional view of FIG. 8 shows the structure of the organic EL lighting panel of the present embodiment. As shown in FIG. 8, the organic EL lighting panel 110 of the present embodiment includes, as main components, the organic EL lighting panel substrate 20, an organic EL layer 111, and a cathode layer 112. The organic EL lighting panel 110 has the same configuration as the organic EL lighting panel 100, except that it includes the organic EL lighting panel substrate 20 instead of the organic EL lighting panel substrate 10.

Next, with reference to FIGS. 9A and 9B, the method for producing the organic EL lighting panel 110 will be described taking, as an illustrative example, the case where the transparent electrode 12 is an ITO electrode and the auxiliary electrode 13 is a copper electrode. It is to be noted, however, that the method for producing the organic EL lighting panel 110 is not limited to the following example.

Figure 9A:
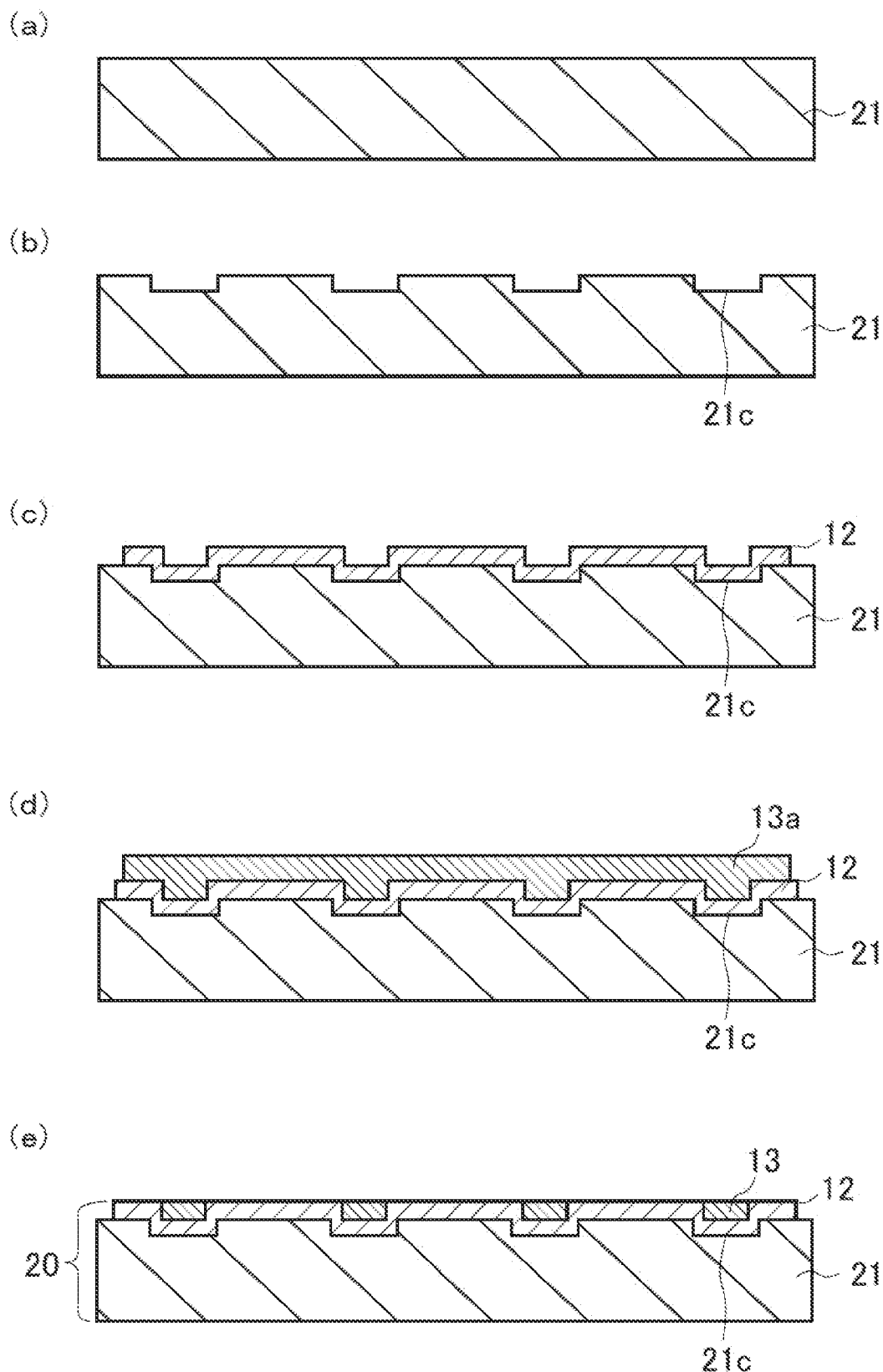
In FIG. 9A, (a) to (e) are sectional views illustrating an example of a method for producing the organic EL lighting panel of Embodiment 4.

First, as shown in (a) in FIG. 9A, a light-transmitting substrate 21 is provided. Next, as shown in (b) in FIG. 9A, on one surface of the light-transmitting substrate 21 (the upper surface in (b) in FIG. 9A), a groove 21c is formed by chemically etching and/or modifying the surface through photoetching or by mechanical processing or the like (a groove forming step). Next, as shown in (c) in FIG. 9A, a transparent electrode 12 formed of ITO is formed on both portions provided with and not provided, with the groove 21c in the light-transmitting substrate 21 by sputtering, for example (a transparent electrode arranging step). Next, as shown in (d) in FIG. 9A, a copper thin film layer 13a is formed, by, for example, plating so as to coat the transparent electrode 12. Furthermore, as shown in (e) in FIG. 9A, the copper thin film layer 13a is subjected to precision polishing by, for example, chemical mechanical polishing to remove the copper on portions other than the groove in the transparent electrode 12, whereby an auxiliary electrode 13 formed of copper is formed in the groove of the transparent electrode 12 (an auxiliary electrode arranging step). In this step, the height of the surface of the auxiliary electrode 13 is adjusted by flattening in order to make the height of the surface of the transparent electrode 12 excluding the groove substantially the same as the height of the surface of the auxiliary electrode 13. In the above-described manner, the organic EL lighting panel substrate 20 shown in FIG. 6(a) can be produced, for example. It is to be noted, however, that the method for producing the organic EL lighting panel substrate 20 is not limited to this example.

Figure 9B:
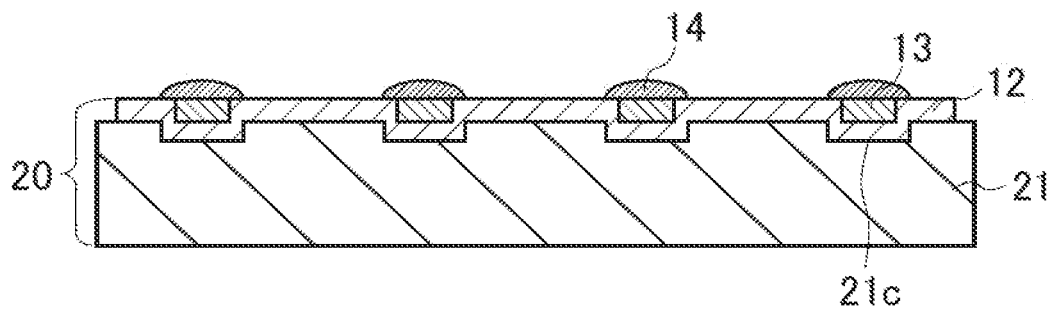
In FIG. 9B, (f) to (h) are sectional views illustrating the example of the method for producing the organic EL lighting panel of Embodiment 4.
Figure 9B:
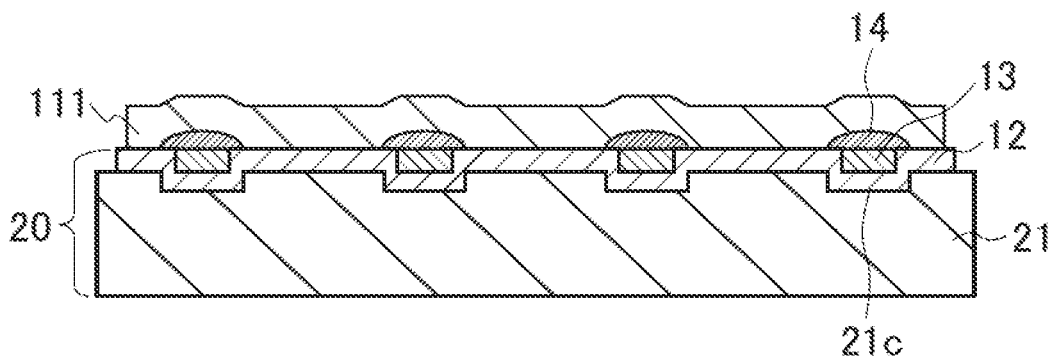
Figure 9B:
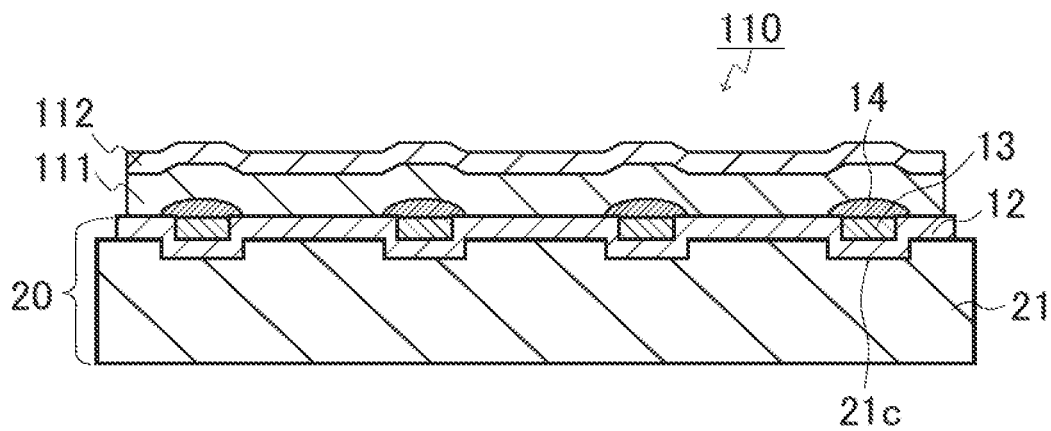

Next, as shown in (f) in FIG. 9B, portions of the auxiliary electrode 13 other than the contact portions with the transparent electrode 12 are coated with an insulating member 14 by photolithography, for example (an insulating member coating step). Next, as shown in (g) in FIG. 9B, an organic EL layer 111 is formed on the transparent electrode 12 and the insulating member 14 by vacuum deposition or the like (an organic EL layer arranging step). Finally, as shown in (h) in FIG. 9B, a cathode layer 112 is formed on the organic EL layer 111 by vacuum deposition or the like (a cathode layer arranging step). In the above-described manner, the organic EL lighting panel 110 can be formed. In the production method of the present example, in order to insulate element parts of the organic EL lighting panel from the external environment, the step of sealing the element parts using a conventionally known sealing material may be performed, for example (not shown in FIGS. 9A and 9B).

In the above-described production method, for example, after the transparent electrode arranging step, a reflective layer that reflects visible light may be formed, on the groove of the transparent electrode (a reflective layer arranging step), and thereafter, the auxiliary electrode arranging step may be performed. In this manner, a substrate having the same configuration as the organic EL lighting panel substrate shown in FIG. 6(c) can be produced, for example.

Embodiment 5

An organic EL lighting panel substrate of the present embodiment is an example of the organic EL lighting panel substrate according to the present invention configured so that the light-transmitting substrate has a multi-layered structure with a groove layer being arranged on an outermost surface of a flat layer, and the auxiliary electrode is arranged in a groove of the groove layer. The sectional view of FIG. 10 shows the structure of the organic EL lighting panel substrate of the present embodiment.

Figure 10:
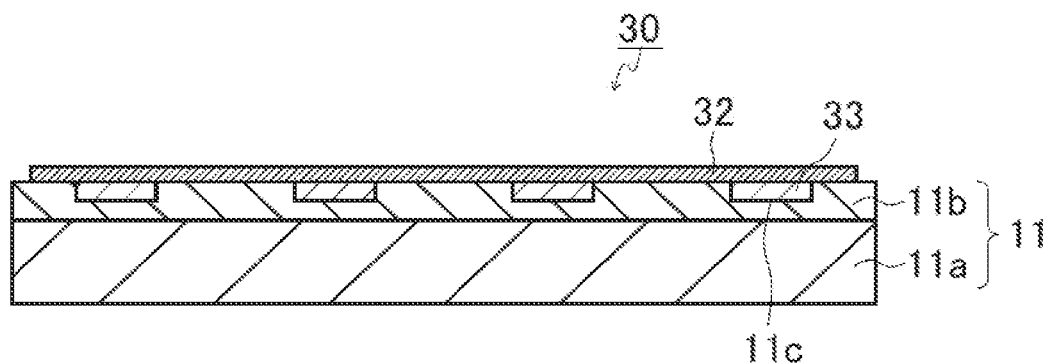
FIG. 10 is a sectional view showing the structure of still another example of the organic EL lighting panel substrate according to the present invention (Embodiment 5).

As shown in FIG. 10, the organic EL lighting panel substrate 30 of the present embodiment includes, as main components, a light-transmitting substrate 11, a transparent electrode 32, and an auxiliary electrode 33. The light-transmitting substrate 11 includes a flat layer 11a and a groove layer 11b laminated on the flat layer 11a. On a surface of the groove layer 11b on the side opposite to the flat layer 11a, a groove 11c (cross section: rectangular) is provided so as to form a grid pattern. In the groove 11c of the groove layer 11b, the auxiliary electrode 33 is arranged. The height of the surface of the groove layer 11b excluding the groove 11c is substantially the same as the height of the surface of the auxiliary electrode 33. The transparent electrode 32 is arranged on the auxiliary electrode 33 and on portions not provided with the groove 11c in the groove layer 11b. The transparent electrode 32 and the auxiliary electrode 33 are electrically connected to each other. With this configuration, as in the case of the organic EL lighting panel substrate 10 shown in FIG. 1, the above-described effects of the present invention can be obtained.

The materials forming the transparent electrode 32 and the auxiliary electrode 33, the methods for forming them, etc. are the same as those for the transparent electrode 12 and the auxiliary electrode 13 in the organic EL lighting panel substrate 10 shown in FIG. 1, for example (the same applies hereinafter).

Embodiment 6

Figure 11:
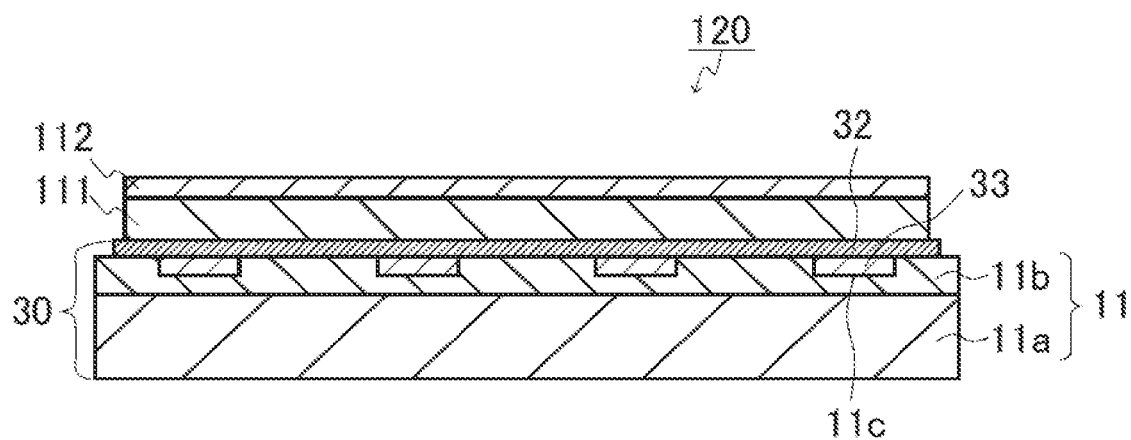
FIG. 11 is a sectional view showing the structure of still another example of the organic EL lighting panel according to the present invention (Embodiment 6).

An organic EL lighting panel of the present embodiment is an example of an organic EL lighting panel that includes the organic EL lighting panel substrate 30 shown in FIG. 10. The sectional view of FIG. 11 shows the structure of the organic EL lighting panel of the present embodiment. As shown in FIG. 11, the organic EL lighting panel 120 of the present embodiment includes, as main components, the organic EL lighting panel substrate 30, an organic EL layer 111, and a cathode layer 112. The organic EL lighting panel 120 has the same configuration as the organic EL lighting panel 100, except that the organic EL lighting panel 120 includes the organic EL lighting panel substrate 30 instead of the organic EL lighting panel substrate 10 and it does not include the insulating member 14.

Next, with reference to FIGS. 12A and 12B, the method for producing the organic EL lighting panel 120 will be described taking, as an illustrative example, the case where the transparent electrode 32 is an ITO electrode and the auxiliary electrode 33 is a copper electrode. It is to be noted, however, that the method for producing the organic EL lighting panel 120 is not limited to the following example.

Figure 12A:
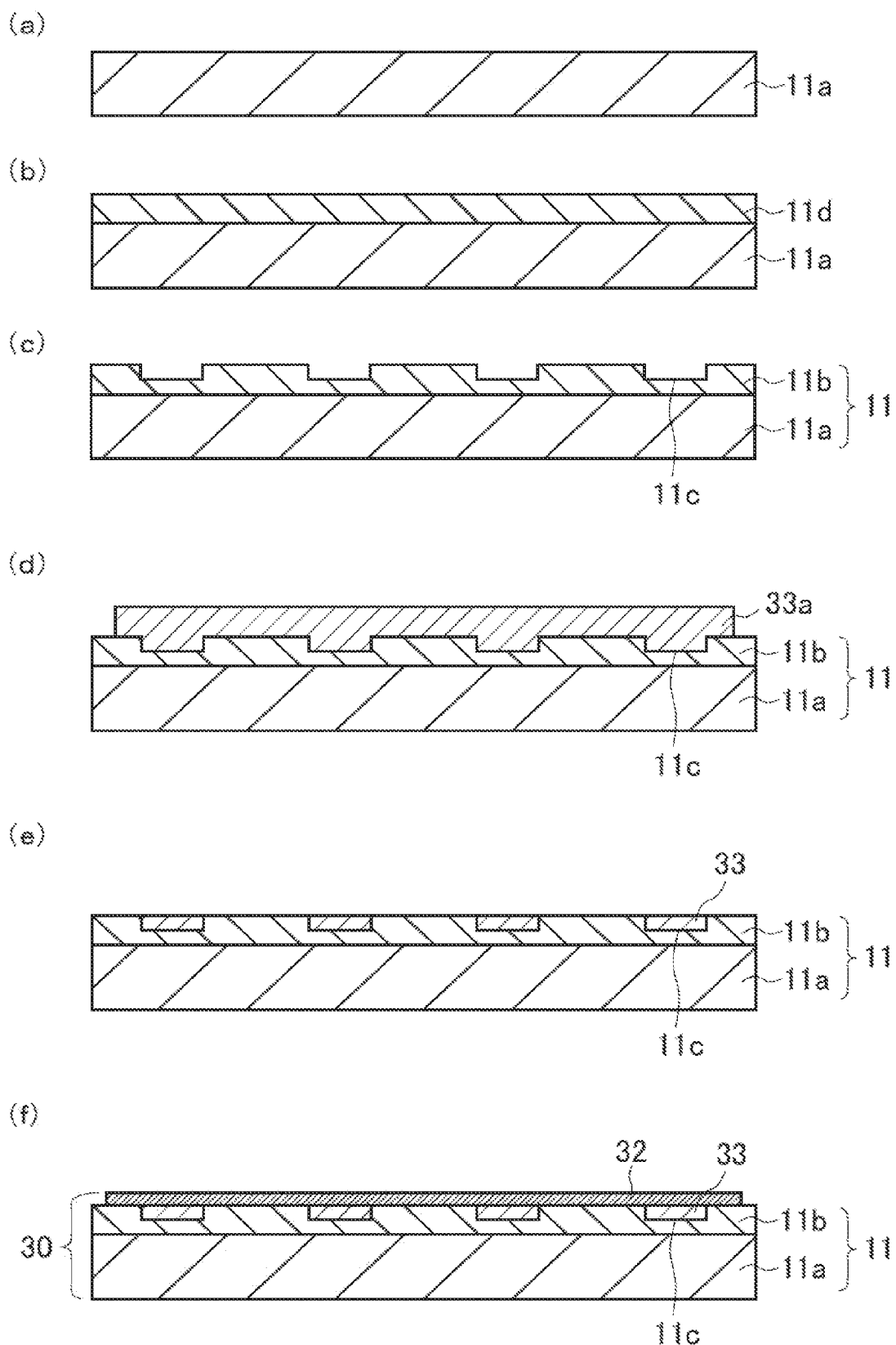
In FIG. 12A, (a) to (f) are sectional views illustrating an example of a method for producing the organic EL lighting panel of Embodiment 6.

First, as shown in (a) in FIG. 12A, a flat layer 11a is provided. Next, as shown in (b) in FIG. 12A, a layer 11d for groove formation is laminate on the flat layer 11a. Specifically, for example, the layer 11d for groove formation is formed by applying the above-described light-transmitting polymeric material onto the flat layer 11a formed of glass or the like by a printing method or the like. In this state, as shown in (c) in FIG. 12A, a groove 11c is formed on the groove formation layer 11d (a groove forming step), whereby a groove layer 11b is provided. Examples of the method for forming the groove lie include: stamping such as pressing or imprinting; photolithography performed by sensitizing the light-transmitting polymeric material; laser processing; and mechanical processing such as fine processing, cutting, or the like with a blade. When the light-transmitting polymeric material is a thermoplastic material, the groove 11c can be formed, easily by stamping such as pressing or imprinting, for example.

Next, as shown in (d) in FIG. 12A, a copper thin film layer 33a is formed on both portions provided with and not provided with the groove 11c in the groove layer 11b by plating, for example. Next, as shown in (e) in FIG. 12A, the copper thin film layer 33a is subjected to precision polishing by, for example, chemical mechanical polishing to remove the copper on the portions not provided with the groove 11c in the groove layer 11b, whereby an auxiliary electrode 33 formed of copper is formed in the groove 11c of the groove layer 11b (an auxiliary electrode arranging step). In this step, the height of the surface of the auxiliary electrode 33 is adjusted by flattening in order to make the height of the groove layer 11b excluding the groove 11c substantially the same as the height of the surface of the auxiliary electrode 33. Furthermore, as shown in (f) in FIG. 12A, a transparent electrode 32 formed of ITO is formed on the portions not provided with the groove 11c in the groove layer 11b and on the auxiliary electrode 33 by sputtering, for example (a transparent electrode arranging step). In the above-described manner, the organic EL lighting panel substrate 30 shown in FIG. 10 can be produced, for example. It is to be noted, however, that the method for producing the organic EL lighting panel substrate 30 is not limited to this example.

Figure 12B:
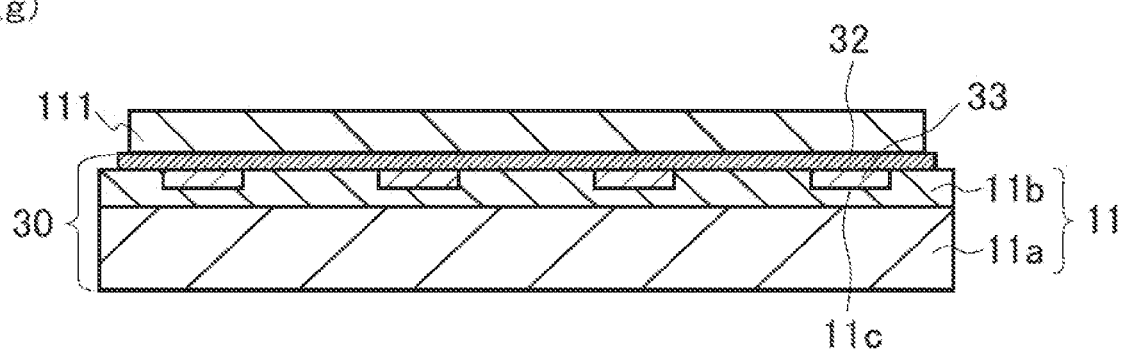
In FIG. 12B, (g) to (h) are sectional views illustrating the example of the method for producing the organic EL lighting panel of Embodiment 6.
Figure 12B:
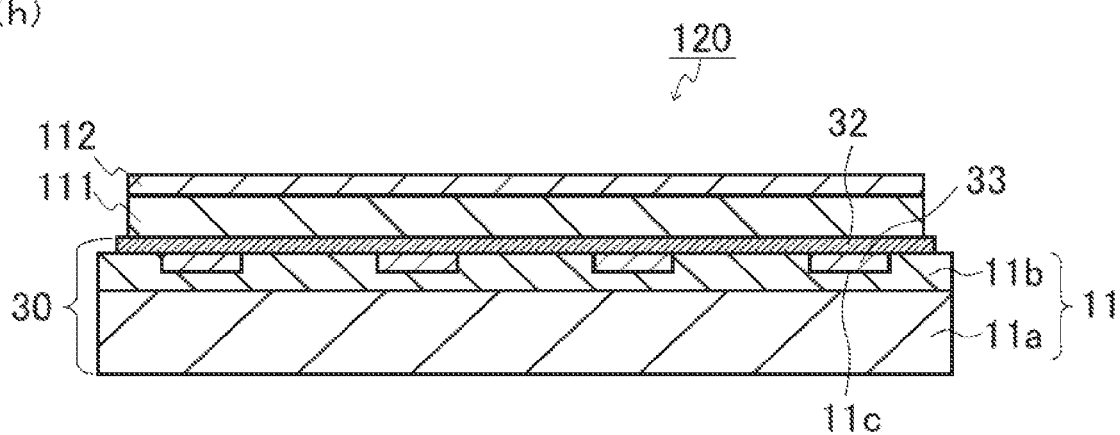

Next, as shown in (g) in FIG. 12B, an organic EL layer 111 is formed on the transparent electrode 12 by vacuum deposition or the like (an organic EL layer arranging step). Finally, as shown in (h) in FIG. 12B, a cathode layer 112 is formed on the organic EL layer 111 by vacuum deposition or the like (a cathode layer arranging step). In the above-described manner, the organic EL lighting panel 120 can be formed. In the production method of the present example, in order to insulate element parts of the organic EL lighting panel from the external environment, the step of sealing the element parts using a conventionally known sealing material may be performed, for example (not shown in FIGS. 12A and 12B).

Embodiment 7

An organic EL lighting panel substrate of the present embodiment is an example of the organic EL lighting panel substrate according to the present invention configured so that a groove is provided in the light-transmitting substrate itself, and the auxiliary electrode is arranged directly in the groove. The sectional view of FIG. 13 shows the structure of the organic EL lighting panel substrate of the present embodiment.

Figure 13:
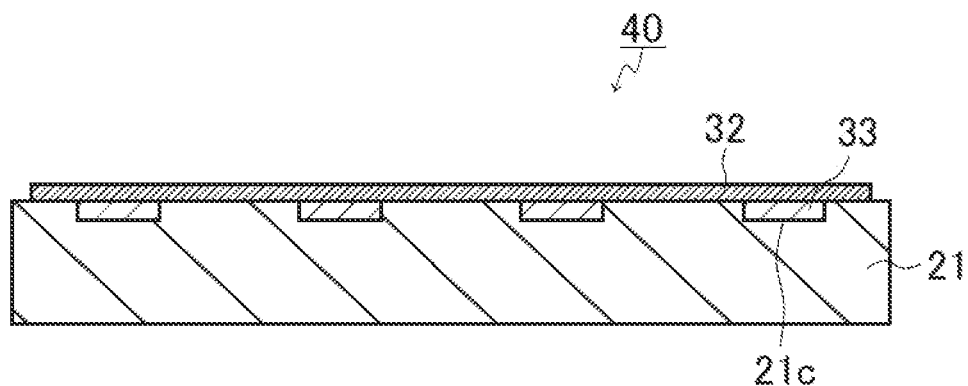
FIG. 13 is a sectional view showing the structure of yet another example of the organic EL lighting panel substrate according to the present invention (Embodiment 7).

As shown in FIG. 13, the organic EL lighting panel substrate 40 of the present embodiment includes, as main components, a light-transmitting substrate 21, a transparent electrode 32, and an auxiliary electrode 33. On one surface of the light-transmitting substrate 21 (an upper surface in FIG. 13), a groove 21c (cross section: rectangular) is provided so as to form a grid pattern. In the groove 21c of the light-transmitting substrate 21, the auxiliary electrode 33 is arranged. The height of the surface of the light-transmitting substrate 21 excluding the groove 21c is substantially the same as the height of the surface of the auxiliary electrode 33. The transparent electrode 32 is arranged on the auxiliary electrode 33 and on portions not provided with the groove 21c in the light-transmitting substrate 21. The transparent electrode 32 and the auxiliary electrode 33 are electrically connected to each other. With this configuration, as in the case of the organic EL lighting panel substrate 10 shown in FIG. 1, the above-described effects of the present invention can be obtained.

Embodiment 8

Figure 14:
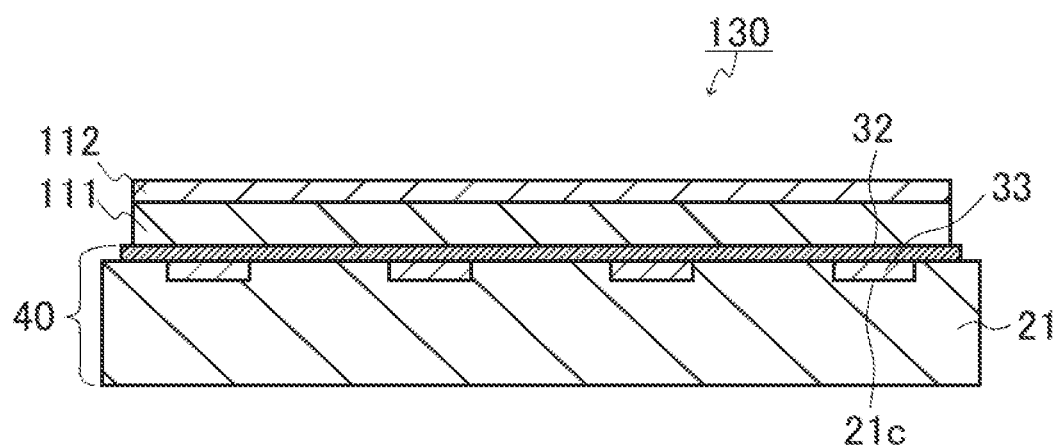
FIG. 14 is a sectional view showing the structure of yet another example of the organic EL lighting panel according to the present invention (Embodiment 8).

An organic EL lighting panel of the present embodiment is an example of an organic EL lighting panel that includes the organic EL lighting panel substrate 40 shown in FIG. 13. The sectional view of FIG. 14 shows the structure of the organic EL lighting panel of the present embodiment. As shown in FIG. 14, the organic EL lighting panel 130 of the present embodiment includes, as main components, the organic EL lighting panel substrate 40, an organic EL layer 111, and a cathode layer 112. The organic EL lighting panel 130 has the same configuration as the organic EL lighting panel 100, except that it includes the organic EL lighting panel substrate 40 instead, of the organic EL lighting panel substrate 10 and it does not include the insulating member 14.

Next, with reference to FIGS. 15A and 15B, the method for producing the organic EL lighting panel 130 will be described taking, as an illustrative example, the case where the transparent electrode 32 is an ITO electrode and the auxiliary electrode 33 is a copper electrode. It is to be noted, however, that the method for producing the organic EL lighting panel 130 is not limited to the following example.

Figure 15A:
In FIG. 15A, (a) to (e) are sectional views illustrating an example of a method for producing the organic EL lighting panel of Embodiment 8.
Figure 15A:
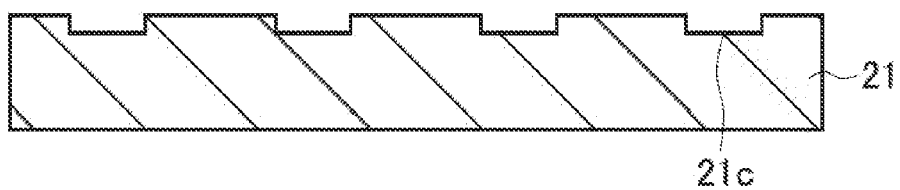
Figure 15A:
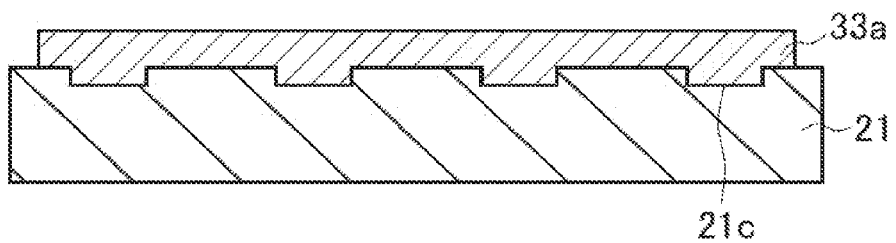
Figure 15A:
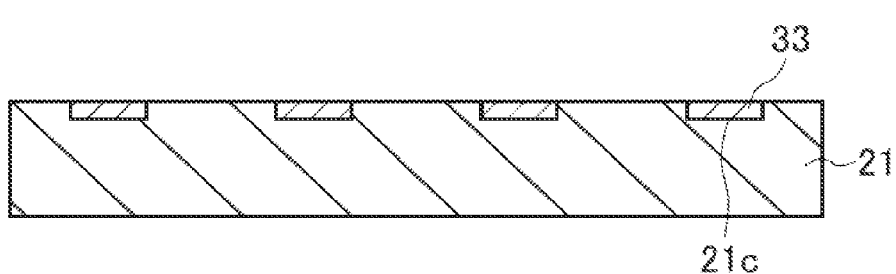
Figure 15A:
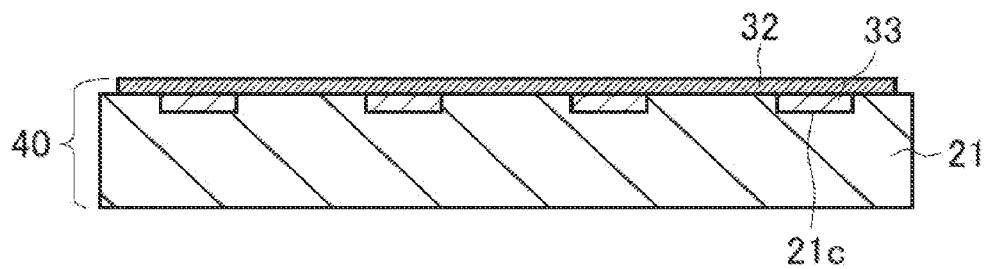

First, as shown in (a) in FIG. 15A, a light-transmitting substrate 21 is provided. Next, as shown in (b) in FIG. 15A, on one surface of the light-transmitting substrate 21 (the upper surface in (b) in FIG. 15A), a groove 21c is formed by chemically etching and/or modifying the surface through photoetching or by mechanical processing or the like (a groove forming step). Next, as shown in (c) in FIG. 15A, a copper thin film layer 33a is formed on both portions provided with and not provided with the groove 21c in the light-transmitting substrate 21 by plating, for example. Next, as shown in (d) in FIG. 15A, the copper thin film layer 33a is subjected to precision polishing by, for example, chemical mechanical polishing to remove the copper on the portions not provided with the groove 21c in the light-transmitting substrate 21, whereby an auxiliary electrode 33 formed of copper is formed in the groove 21c on the light-transmitting substrate 21 (an auxiliary electrode arranging step). In this step, the height of the surface of the auxiliary electrode 33 is adjusted by flattening in order to make the height of the surface of the light-transmitting substrate 21 excluding the groove 21c substantially the same as the height of the surface of the auxiliary electrode 33. Furthermore, as shown in (e) in FIG. 15A, a transparent electrode 32 formed of ITO is formed on the portions not provided with the groove 21c in the light-transmitting substrate 21 and on the auxiliary electrode 33 by sputtering, for example (a transparent electrode arranging step). In the above-described manner, the organic EL lighting panel substrate 40 shown in FIG. 13 can be produced, for example. It is to be noted, however, that the method for producing the organic EL lighting panel substrate 40 is not limited to this example.

Figure 15B:
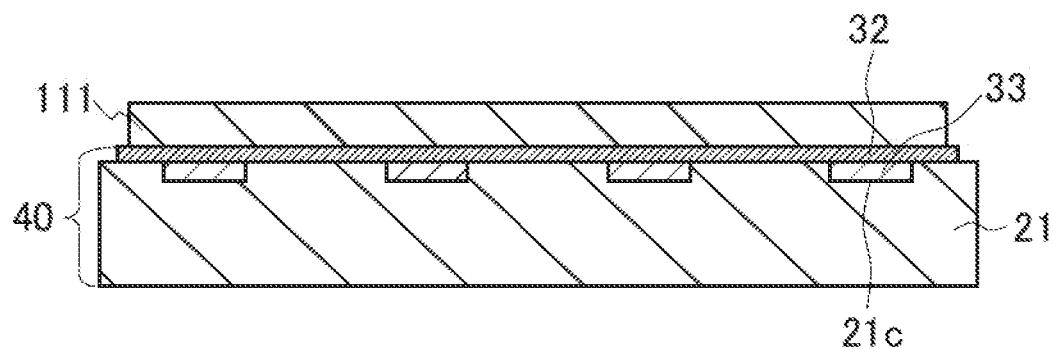
In FIG. 15B, (f) to (g) are sectional views illustrating the example of the method for producing the organic EL lighting panel of Embodiment 8.
Figure 15B:
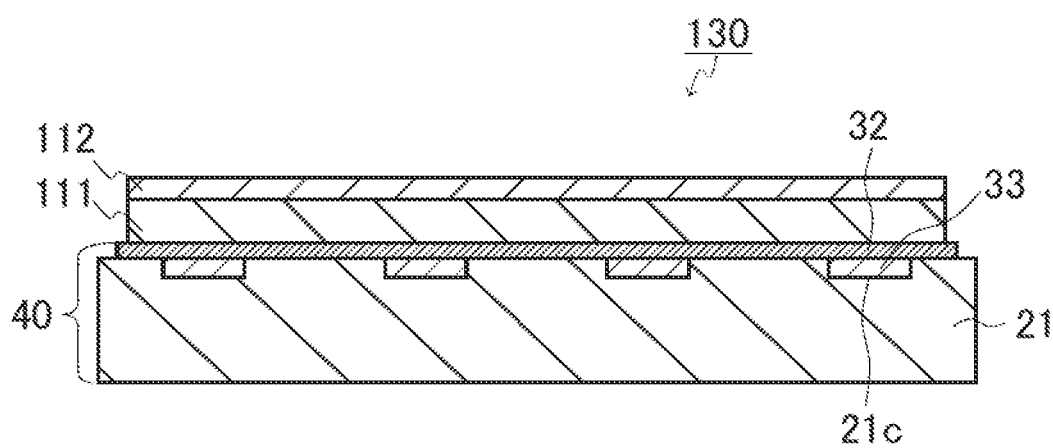

Next, as shown in (f) in FIG. 15B, an organic EL layer 111 is formed on the transparent electrode 32 by vacuum deposition or the like (an organic EL layer arranging step). Finally, as shown in (g) in FIG. 15B, a cathode layer 112 is formed on the organic EL layer 111 by vacuum deposition or the like (a cathode layer arranging step). In the above-described manner, the organic EL lighting panel 130 can be formed. In the production method of the present example, in order to insulate element parts of the organic EL lighting panel from the external environment, the step of sealing the element parts using a conventionally known sealing material may be performed, for example (not shown in FIGS. 15A and 15B).

EXAMPLES

Next, the present invention will be described in further details with reference to examples of the present invention. It is to be noted, however, that the present invention is by no means limited or restricted by the following examples.

Example 1

(1) Production of Organic EL Lighting Panel

As an organic EL lighting panel the present example, the organic EL lighting panel 100 shown in FIG. 4 was produced in the following manner. First, as a flat layer 11a, an alkali-free glass sheet (thickness: 0.7 mm, Nippon Electric Glass Co., Ltd.) was provided. As a light-transmitting polymeric material, urethane acrylate (trade name: "UV6300B", The Nippon Synthetic Chemical Industry Co., Ltd.) was applied onto the alkali-free glass sheet 11a with a bar coater so that the resultant coating had a thickness of 50 μm. Thereafter, the coating was heated, to 100° C., and a groove 11c was formed thereon by embossing. Thus, a groove layer 11b was provided. Next, as a transparent electrode 12, a film of ITO (an ITO film 12) was formed on the groove layer 11b by sputtering. Subsequently, a copper thin film, layer 13a was formed so as to coat the ITO film 12 by plating. Portions of this copper thin film layer 13a other than those in the groove of the ITO film 12 were polished and flattened by chemical mechanical polishing using an abrasive until the ITO surface was exposed. Thus, an auxiliary electrode (auxiliary wiring) 13 formed of copper was provided. As the abrasive, a cerium oxide-based, abrasive (trade name: "HS-H635", Hitachi Chemical Company, Ltd.) was used. In the above-described manner, the organic EL lighting panel substrate including the ITO film 12 as an anode (transparent electrode) and the auxiliary wiring 13 formed of copper were produced.

Next, an acrylic negative photoresist having transparency (trade name: "JNPC-72", JSR Corporation) was applied onto the copper auxiliary wiring 13 and the ITO film 12, and patterning was performed by photolithography so as to form an insulating member (protective film) 14 on the copper auxiliary wiring 13. Next, an organic EL layer 111 was formed on the ITO film 12 and the protective film 14 by sputtering. Finally, an aluminum cathode layer 112 was formed on the organic EL layer 111 by sputtering. In the above-described manner, the organic EL lighting panel 100 shown in FIG. 4 was produced. The organic EL layer 111 was a laminate including a hole injection layer, a hole transport layer, a light-emitting layer, a hole block layer, an electron transport layer, and an electron injection layer in this order from the ITO film 12 side. Materials used for forming the respective layers in the laminate were as follows.

Hole injection layer: Cu-Pc (copper phthalocyanine)
Hole transport layer: α-NPD (N,N'-diphenyl-N—N-bis(1-naphthyl)-1,1'-biphenyl)-4,4'-diamine)
Light-emitting layer:
  Host; CBP (4,4'-bis-carbazolyl biphenyl)
  Dopant; Ir(ppy)$_3$(tris-(2-phenylpyridine)iridium complex),
  Btp$_2$Ir(acac) (bis(2-(2'-benzo(4,5-α)thienyl)pyridinato-N, C2')(acetylacetonato) iridium complex), and FIr(pic) ((bis (4,6-di-fluorophenyl)-pyridinato-N,C2') picolinate iridium complex)
Hole block layer: BCP (2,9-dimethyl-4,7-diphenyl-1,10-phenanthroline)
Electron transport layer: Alq$_3$
Electron injection layer: LiF

(2) Characteristic Evaluation

(2-1) Evaluation of Uniformity in Luminance

The organic EL lighting panel of the present example was turned on by applying a constant current of 25 A/m$^2$ as a driving current. The driving voltage was 4.6 V, and the luminance was 1100 cd/m$^2$. The uniformity in luminance of this organic EL lighting panel was evaluated in the following manner. Specifically, the luminance was measured at 9 points in a plane of this organic EL lighting panel, and among the luminances measured at the 9 points, a maximum luminance and a minimum luminance were substituted into the following equation (I) to calculate the uniformity in luminance (the same applies hereinafter). The smaller value of the uniformity in luminance (%) indicates the higher uniformity in luminance in the organic EL lighting panel. The uniformity in luminance in this organic EL lighting panel was 3%.

$$\text{Uniformity in luminance (\%)} = (\text{Maximum luminance} - \text{Minimum luminance})/\text{Maximum luminance} \times 100 \quad (I)$$

(2-2) Continuous Lighting Evaluation

Furthermore, the organic EL lighting panels of the present example (n=10) were continuously turned on at the same current density as in the experiment described in the above item (2-1). As a result, all the organic EL lighting panels were kept being turned on stably even when the continuous lighting time exceeded 10000 hours.

Comparative Example 1

(1) Production of Organic EL Lighting Panel

Figure 16:
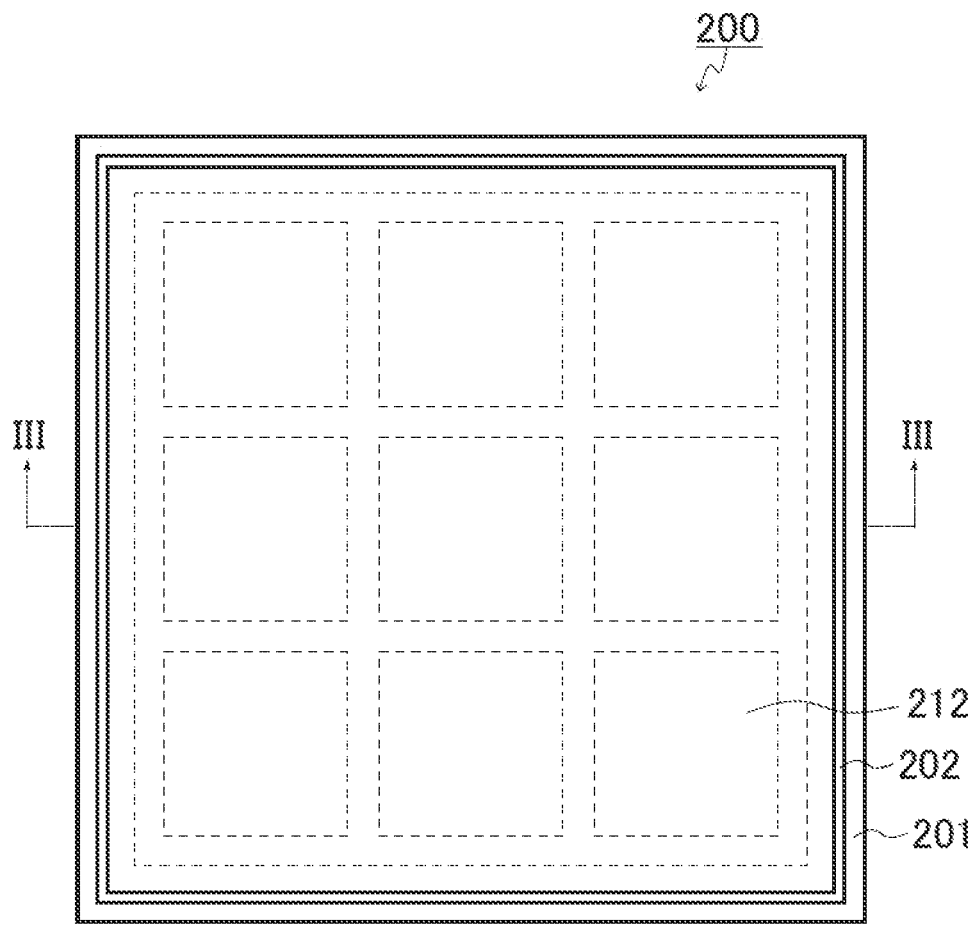
FIG. 16(a) is a plan view showing the structure of an organic EL lighting panel of Comparative Example 1.
FIG. 16(b) is a sectional view of the organic EL lighting panel, viewed along arrows III-III in FIG. 16(a).
Figure 16:
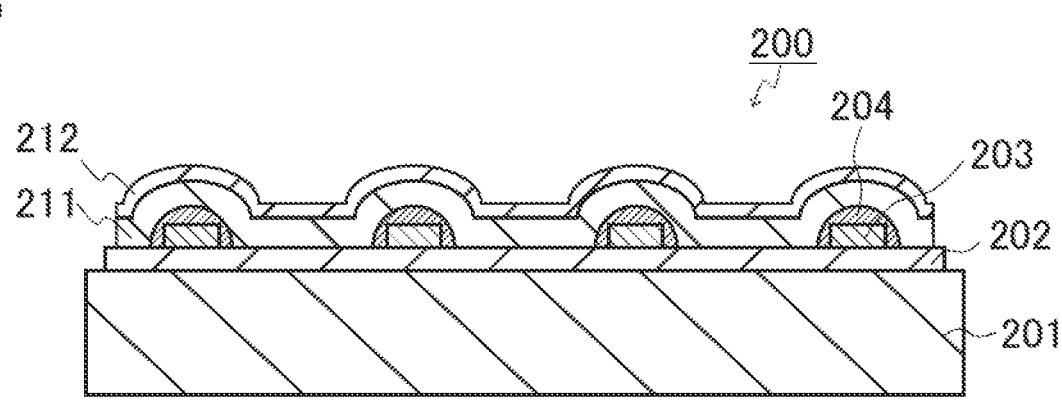

As an organic EL lighting panel of the present comparative example, an organic EL lighting panel 200 shown in FIG. 16 was produced in the same manner as in Example 1, except that the groove was not formed in a light-transmitting substrate. In FIG. 16, numeral 201 denotes a light-transmitting substrate, numeral 202 denotes a transparent electrode, numeral 203 denotes an auxiliary electrode, numeral 204 denotes an insulating member, numeral 211 denotes an organic EL layer, and numeral 212 denotes a cathode layer.

(2) Characteristic Evaluation

(2-1) Evaluation of uniformity in luminance

The organic EL lighting panel of the present comparative example was turned on by applying a constant current of 25 A/m$^2$ as a driving current. The driving voltage was 5.0 V, and the luminance was 870 cd/m$^2$. The uniformity in luminance of this organic EL lighting panel was 9%.

(2-2) Continuous Lighting Evaluation

Furthermore, the organic EL lighting panels of the present comparative example (n=10) were continuously turned on at the same current density as in the experiment described in the above item (2-1). As a result, three out of the ten organic EL lighting panels were turned off within 1700 hours owing to the occurrence of a short circuit.

Comparative Example 2

(1) Production Organic EL Lighting Panel

The organic EL lighting panel of the present comparative example was produced in the same manner as in Comparative Example 1, except that the auxiliary electrode was not formed.

(2) Characteristic Evaluation

(2-1) Evaluation of Uniformity in Luminance

The organic EL lighting panel of the present comparative example was turned on by applying a constant current of 25 A/m$^2$ as a driving current. The driving voltage was 5.7 V, and the luminance was 795 cd/m$^2$. The uniformity in luminance of this organic EL lighting panel was 35%.

(2-2) Continuous Lighting Evaluation

Furthermore, the organic EL lighting panels of the present comparative example (n=10) were continuously turned on at the same current density as in the experiment described in the above item (2-1). As a result, five out of the ten organic EL lighting panels were turned off within 1000 hours owing to the occurrence of a short circuit.

The above results revealed that the organic EL lighting panel of Example 1 exhibited high uniformity in luminance in the plane, and also exhibited high reliability because a short circuit was prevented from occurring. In contrast, the organic EL lighting panels of Comparative Examples 1 and 2 exhibited low uniformity in luminance in the plane, and also exhibited low reliability because of the occurrence of a short circuit.

As specifically described above, the organic EL panel substrate according to the present invention and the organic EL lighting panel using the same can improve the uniformity in luminance and chromaticity in an organic EL lighting panel plane and can suppress deterioration in reliability due to disconnection and the like caused by an auxiliary electrode. Therefore, the organic EL lighting panel according to the present invention is applicable to an organic EL lighting device, a backlight of a liquid crystal display or the like, etc., for example. The use of the organic EL lighting panel of the present invention is not limited to those described above, and the EL lighting panel of the present invention is applicable to a wide range of fields.

While the present invention has been described above with reference to embodiments and examples, the present invention is by no means limited thereto. Various changes and modifications that may become apparent to those skilled in the art may be made in the configuration and specifics of the present invention without departing from the scope of the present invention.

This application claims priority from Japanese Patent Application No. 2012-91282 filed on Apr. 12, 2012. The entire disclosure of this Japanese patent application is incorporated herein by reference.

EXPLANATION OF REFERENCE NUMERALS 10, 20, 30, 40: organic EL lighting panel substrate
11, 21: light-transmitting substrate
11a: planar layer (flat layer)
11b: layer having groove (groove layer)
11c: groove in groove layer
11d: layer for groove formation
12, 32: transparent electrode
13, 33: auxiliary electrode
13a, 33a: copper thin film layer
14: insulating member
15: reflective layer
21c: groove of light-transmitting substrate
100, 110, 120, 130: organic EL lighting panel
111: organic EL layer
112: cathode layer
200: organic EL lighting panel
201: light-transmitting substrate 202: transparent electrode
203: auxiliary electrode
204: insulating member
211: organic EL layer
212: cathode layer

The invention claimed is:

1. An organic EL lighting panel substrate comprising:
a light-transmitting substrate;
a transparent electrode, the transparent electrode being arranged on one surface of the light-transmitting substrate; and
an auxiliary electrode electrically connected to the transparent electrode,
wherein the light-transmitting substrate has a groove with a planar shape formed in a grid pattern,
the auxiliary electrode is arranged in said groove of the light-transmitting substrate, and
the auxiliary electrode is formed of a material having a volume resistivity at 20° C. in the range from $1.59 \times 10^{-8}$ to $13 \times 10^{-8}$ Ω·m.

2. The organic EL lighting panel substrate according to claim 1, wherein the auxiliary electrode comprises at least one selected from the group consisting of copper, aluminum, silver, gold, molybdenum, tungsten, nickel, an aluminum-molybdenum alloy, an aluminum-neodymium alloy, and an aluminum-nickel alloy.

3. The organic EL lighting panel substrate according to claim 1, wherein in the groove with the planar shape formed in the grid pattern of the light-transmitting substrate, the transparent electrode and the auxiliary electrode are arranged in this order from the light-transmitting substrate side.

4. The organic EL lighting panel substrate according to claim 3, wherein the auxiliary electrode is arranged in such a manner that the height of a surface of the transparent electrode excluding a groove is substantially the same as the height of a surface of the auxiliary electrode.

5. The organic EL lighting panel substrate according to claim 1, wherein in the auxiliary electrode, portions electrically connected to the transparent electrode comprise side surfaces of the auxiliary electrode.

6. The organic EL lighting panel substrate according to claim 1, further comprising an insulating member, wherein the auxiliary electrode is coated with the insulating member.

7. The organic EL lighting panel substrate according to claim 1, further comprising a reflective layer that reflects visible light, wherein the reflective layer is arranged between the transparent electrode and the auxiliary electrode.

8. The organic EL lighting panel substrate according to claim 1, wherein the auxiliary electrode is arranged directly in the groove with the planar shape formed in the grid pattern of the light-transmitting substrate, and the transparent electrode is arranged on the auxiliary electrode.

9. The organic EL lighting panel substrate according to claim 1, wherein the light-transmitting substrate has a multi-layered structure with a layer having a groove with the planar shape formed in the grid pattern being arranged on an outermost surface of a planar layer.

10. The organic EL lighting panel substrate according to claim 9, wherein the layer having the groove with the planar shape formed in the grid pattern has a refractive index that is not lower than the refractive index of the planar layer and not higher than the refractive index of the transparent electrode.

11. The organic EL lighting panel substrate according to claim 9, wherein the layer having the groove with the planar shape formed in the grid pattern has a refractive index in the range from 1.5 to 1.9.

12. The organic EL lighting panel substrate according to claim 1, wherein the cross-sectional shape of the groove of the light-transmitting substrate is at least one of a polygonal shape and a semicircular shape.

13. An organic EL lighting panel comprising:
an organic EL lighting panel substrate;
an organic EL layer; and
a cathode layer,
wherein the organic EL lighting panel substrate is the organic EL lighting panel substrate according to claim 1, and
the organic EL layer and the cathode layer are laminated on the transparent electrode in this order.

14. The organic EL lighting panel according to claim 13, further comprising:
a power feed contact portion for an anode near an end of the transparent electrode; and
a power feed contact portion for a cathode near an end of the cathode layer,
wherein both the power feed contact portions are formed of the same material as the auxiliary electrode.

15. An organic EL lighting device comprising: the organic EL lighting panel according to claim 13.

16. The organic EL lighting panel substrate according to claim 2, wherein in the groove with the planar shape formed in the grid pattern of the light-transmitting substrate, the transparent electrode and the auxiliary electrode are arranged in this order from the light-transmitting substrate side.

17. The organic EL lighting panel substrate according to claim 2, wherein in the auxiliary electrode, portions electrically connected to the transparent electrode comprise side surfaces of the auxiliary electrode.

18. The organic EL lighting panel substrate according to claim 3, wherein in the auxiliary electrode, portions electrically connected to the transparent electrode comprise side surfaces of the auxiliary electrode.

19. The organic EL lighting panel substrate according to claim 4, wherein in the auxiliary electrode, portions electrically connected to the transparent electrode comprise side surfaces of the auxiliary electrode.

20. The organic EL lighting panel substrate according to claim 2, further comprising an insulating member, wherein the auxiliary electrode is coated with the insulating member.

* * * * *